| (12) | United States Patent | (10) Patent No.: US 11,050,041 B2 |
|---|---|---|
| | Choi et al. | (45) Date of Patent: Jun. 29, 2021 |

(54) DISPLAY PANEL AND ELECTRONIC DEVICE INCLUDING THE SAME

(71) Applicant: SAMSUNG DISPLAY CO., LTD., Yongin-si (KR)

(72) Inventors: Wonwoo Choi, Hwaseong-si (KR); Sooyoun Kim, Siheung-si (KR); Junghan Seo, Hwaseong-si (KR); Wooyong Sung, Seoul (KR); Seoyeon Lee, Namyangju-si (KR); Hyoungsub Lee, Yongin-si (KR); Moonwon Chang, Yongin-si (KR); Seunggun Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/516,437

(22) Filed: Jul. 19, 2019

(65) Prior Publication Data

US 2020/0144341 A1 May 7, 2020

(30) Foreign Application Priority Data

Nov. 2, 2018 (KR) ........................ 10-2018-0133241

(51) Int. Cl.
*H01L 27/32* (2006.01)
*H01L 51/52* (2006.01)

(52) U.S. Cl.
CPC ...... *H01L 51/5253* (2013.01); *H01L 27/3246* (2013.01); *H01L 27/3258* (2013.01)

(58) Field of Classification Search
None
See application file for complete search history.

(56) References Cited

U.S. PATENT DOCUMENTS

| 9,632,487 B2 | 4/2017 | Kim et al. |
| 9,859,334 B2 | 1/2018 | Kim et al. |
| 9,905,629 B2 | 2/2018 | Kim et al. |
| 10,205,122 B2 | 2/2019 | Choi et al. |

(Continued)

FOREIGN PATENT DOCUMENTS

| KR | 10-2017-0015632 | 2/2017 |
| KR | 10-2017-0059527 | 5/2017 |

(Continued)

*Primary Examiner* — J. E. Schoenholtz
(74) *Attorney, Agent, or Firm* — F. Chau & Associates, LLC

(57) ABSTRACT

A display panel includes a peripheral region adjacent to a display region. The display region includes a hole peripheral region, and a recessed region is overlapped with the hole peripheral region. The display panel also includes a barrier layer with a penetrating opening overlapped with the recessed region, a circuit layer on the barrier layer and including transistor and insulating layers, and a device layer including an organic light emitting area coupled to the circuit layer. In addition, a module hole is overlapped with the hole peripheral region and penetrates the base substrate, and a first groove is overlapped with the hole peripheral region and corresponds to a portion of the base substrate that is recessed from a top surface of the barrier layer and that encloses the module hole. The insulating layers include inorganic layers and an organic layer having side portions enclosing the module hole.

14 Claims, 26 Drawing Sheets

(56) References Cited

U.S. PATENT DOCUMENTS

| | | |
|---|---|---|
| 10,230,069 B2 | 3/2019 | Choi et al. |
| 10,541,380 B1 | 1/2020 | Sung et al. |
| 10,553,819 B2 | 2/2020 | Kim et al. |
| 10,673,020 B2 * | 6/2020 | Kim .................... H01L 27/3244 |
| 2017/0150618 A1 | 5/2017 | Choi et al. |
| 2017/0244063 A1 * | 8/2017 | Furuie ................. H01L 51/5246 |
| 2019/0245160 A1 | 8/2019 | Yoon et al. |

FOREIGN PATENT DOCUMENTS

| | | |
|---|---|---|
| KR | 10-2017-0059864 | 5/2017 |
| KR | 10-2017-0066767 | 6/2017 |
| KR | 10-2017-0095444 | 8/2017 |
| KR | 10-2017-0115177 | 10/2017 |
| KR | 10-2017-0134903 | 12/2017 |
| KR | 10-2019-0094269 | 8/2019 |
| KR | 10-2019-0095624 | 8/2019 |
| KR | 10-2020-0026381 | 3/2020 |

\* cited by examiner

DISPLAY PANEL AND ELECTRONIC DEVICE INCLUDING THE SAME

CROSS-REFERENCE RELATED APPLICATIONS

This U.S. non-provisional patent application claims priority under 35 U.S.C. § 119 to Korean Patent Application No. 10-2018-0133241, filed on Nov. 2, 2018, in the Korean Intellectual Property Office, the entire contents of which are hereby incorporated by reference.

BACKGROUND OF THE INVENTION

1. Field

One or more embodiments disclosed herein relate to a display panel and an electronic device including a display panel.

2. Description of Related Art

An organic light emitting display panel generates images based on light emitted from organic light emitting elements. Such a display panel has low power consumption, improved brightness, and faster reaction speed compared with other displays. However, they are not without drawbacks. For example, organic light emitting elements are vulnerable to becoming defective because of the infiltration of moisture or oxygen.

SUMMARY

According to an embodiment of the inventive concept, a display panel includes a base substrate which includes a display region and a peripheral region adjacent to the display region, the display region including a hole peripheral region and the base substrate further including a recessed region, the recessed region overlapped with the hole peripheral region and formed by recessing at least a portion of the base substrate; a barrier layer covering the base substrate and including an opening, the opening overlapped with the recessed region and penetrating the barrier layer; a circuit layer on the barrier layer and including a transistor and a plurality of insulating layers; a device layer including an organic light emitting area coupled to the circuit layer; a module hole overlapped with the hole peripheral region and penetrating the base substrate; and a first groove overlapped with the hole peripheral region and corresponding to a portion of the base substrate recessed from a top surface of the barrier layer and enclosing the module hole, wherein the insulating layers include a first inorganic layer, a second inorganic layer on the first inorganic layer, and an organic layer on the second inorganic layer, and a side portion of each of the first inorganic layer and the second inorganic layer adjacent to the module hole encloses the module hole and is covered by the organic layer.

The side portion of each of the first inorganic layer and the second inorganic layer may be spaced apart from the first groove. The circuit layer may include an additional inorganic layer between the first inorganic layer and the second inorganic layer, and a side portion of the additional inorganic layer adjacent to the module hole is covered with the organic layer. The circuit layer may include an additional organic layer between the organic layer and the organic light emitting area and including a contact hole penetrating the additional organic layer; and a connection electrode connecting the transistor to the organic light emitting area through the contact hole, wherein the additional organic layer covers the organic layer.

A side portion of each of the first inorganic layer and the second inorganic layer may have a closed loop shape enclosing the first groove. The first groove may be between the module hole and the side portion and has a closed loop shape enclosing the module hole. The display panel may include an encapsulation layer on the device layer, wherein the encapsulation layer may include a first inorganic encapsulation layer covering the device layer, a second inorganic encapsulation layer, and an organic encapsulation layer between the first inorganic encapsulation layer and the second inorganic encapsulation layer, and wherein the first groove may define an internal space formed by at least one of the first inorganic encapsulation layer and the second inorganic encapsulation layer covering an inner surface of the recessed region and an inner surface of the opening.

The display panel may include a planarization layer filling the internal space and disposed on the second inorganic encapsulation layer to provide a flat surface, along with the second inorganic encapsulation layer, wherein the module hole may penetrate the planarization layer. The planarization layer may include a same material as the organic encapsulation layer. The display panel may include an input sensing area on the encapsulation layer and including an organic sensing layer covering a sensing electrode, wherein the planarization layer may include a same material as the organic sensing layer.

The display panel may include a second groove overlapped with the hole peripheral region and between the side portion of each of the first inorganic layer and the second inorganic layer and the first groove to enclose the module hole, wherein the second groove may be a portion of the base substrate recessed from a top surface of the barrier layer and is covered with the first inorganic encapsulation layer, and wherein an internal space of the second groove may be filled with the organic encapsulation layer. The display panel may include an additional pattern portion between the first inorganic encapsulation layer and a surface of the base substrate overlapped with the first groove, wherein the additional pattern portion may include at least one of organic materials or metal materials.

A portion of the barrier layer, which covers a portion of the base substrate overlapped with the first groove, may correspond to a tip portion, and the tip portion may be spaced apart from the side portion of each of the first inorganic layer and the second inorganic layer. The display panel may include a dam portion between the first groove and the second groove, the dam portion may be covered by at least one of the first inorganic encapsulation layer and the second inorganic encapsulation layer, wherein the dam portion may include a same material as at least one of the insulating layers.

According to an embodiment of the inventive concept, an electronic device includes a base substrate including a display region and a peripheral region, the display region including a hole peripheral region and the peripheral region adjacent to the display region; a barrier layer covering the base substrate; a circuit layer on the barrier layer and including a transistor and a plurality of insulating layers; a device layer including an organic light emitting area coupled to the circuit layer; a module hole overlapped with the hole peripheral region and penetrating the base substrate; and grooves overlapped with the hole peripheral region and spaced apart from each other, each of the grooves corresponding to a portion of the base substrate recessed from a top surface of the barrier layer and enclosing the module hole, wherein the insulating layers include: a first inorganic layer on the barrier layer and including an inorganic material, a second inorganic layer on the first inorganic layer and including an inorganic material, and an organic layer on the second inorganic layer and including an organic material, and wherein: a side portion of each of the first inorganic layer and the second inorganic layer, which are adjacent to the module hole, encloses the module hole, and the organic layer covers the side portion of each of the first inorganic layer and the second inorganic layer adjacent to the module hole.

The barrier layer and insulating layers may be overlapped with each of the grooves and correspond to a tip portion, and the tip portion covers a portion of the base substrate may be overlapped with each of the grooves. The tip portion may be spaced apart from the side portion of each of the first inorganic layer and the second inorganic layer. The electronic device may include an electronic module overlapped with the module hole and disposed on a rear surface of the base substrate. The electronic module may include at least one of a sound output module, a light-emitting module, a light-receiving module, or a camera module.

The electronic device may include an encapsulation layer including a first inorganic encapsulation layer covering the device layer, a second inorganic encapsulation layer on the first inorganic encapsulation layer, and an organic encapsulation layer between the first inorganic encapsulation layer and the second inorganic encapsulation layer, wherein the grooves may be covered with at least one of the first or second inorganic encapsulation layer. Widths of the grooves may be different from each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
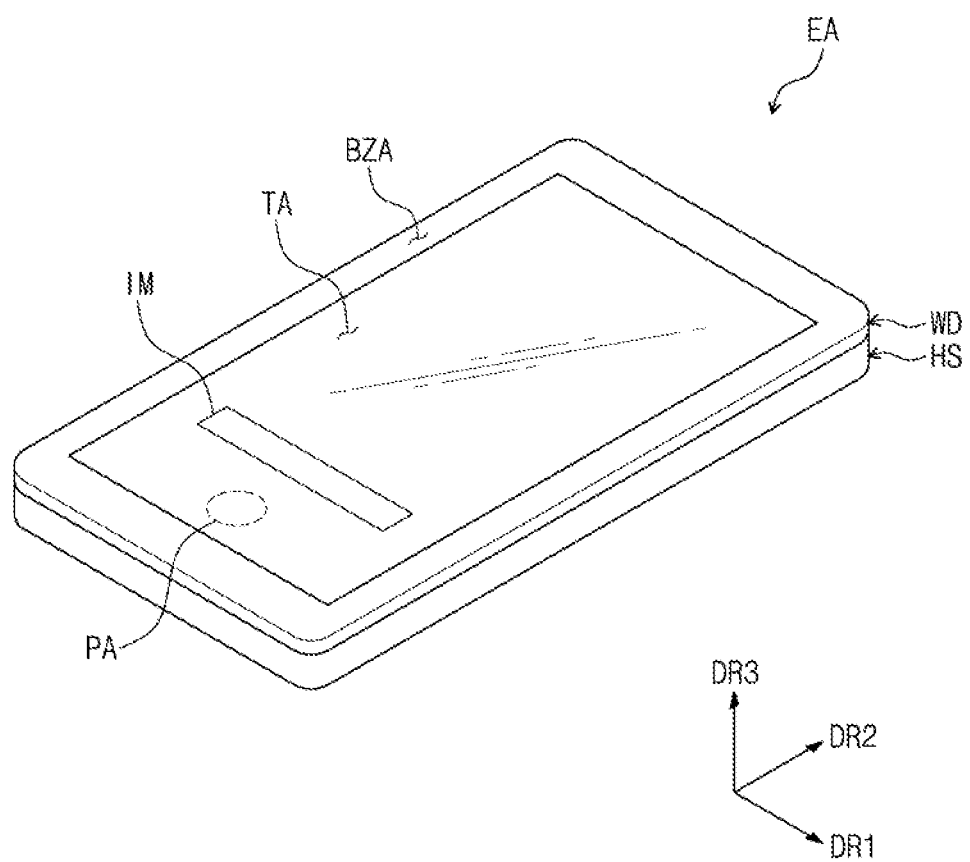
FIG. 1 illustrates an electronic device.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly defined herein.

Figure 2:
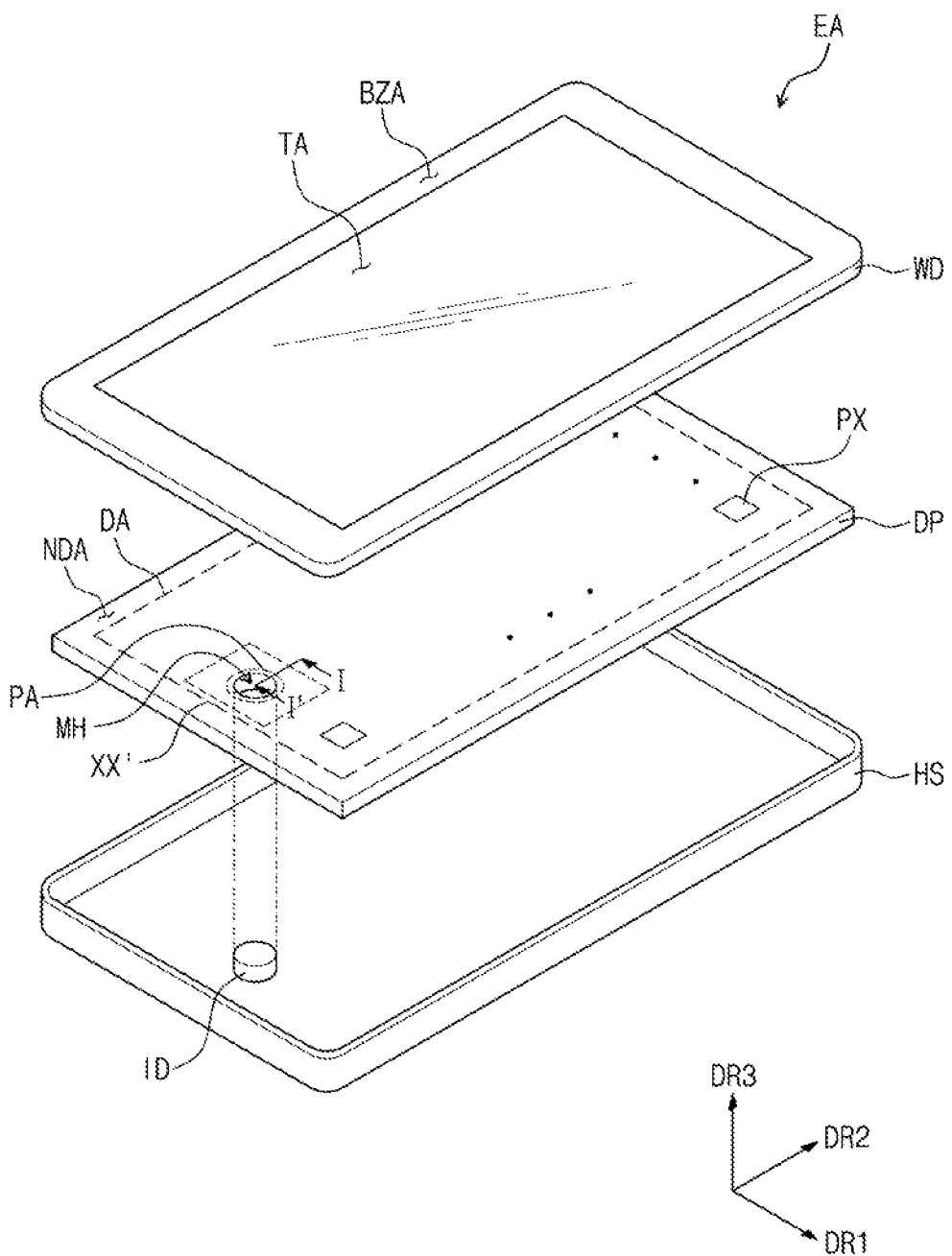
FIG. 2 illustrates an exploded perspective view of the electronic device.
Figure 3:
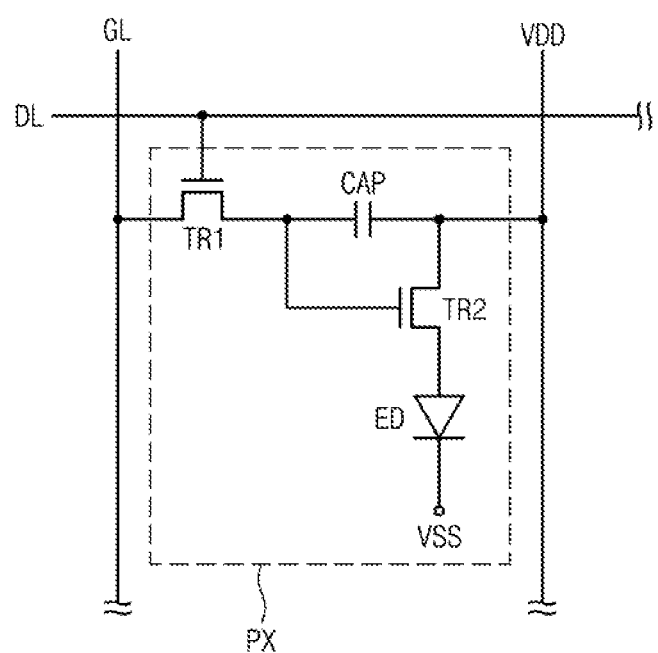
FIG. 3 illustrates an embodiment of a pixel.
Figure 4:
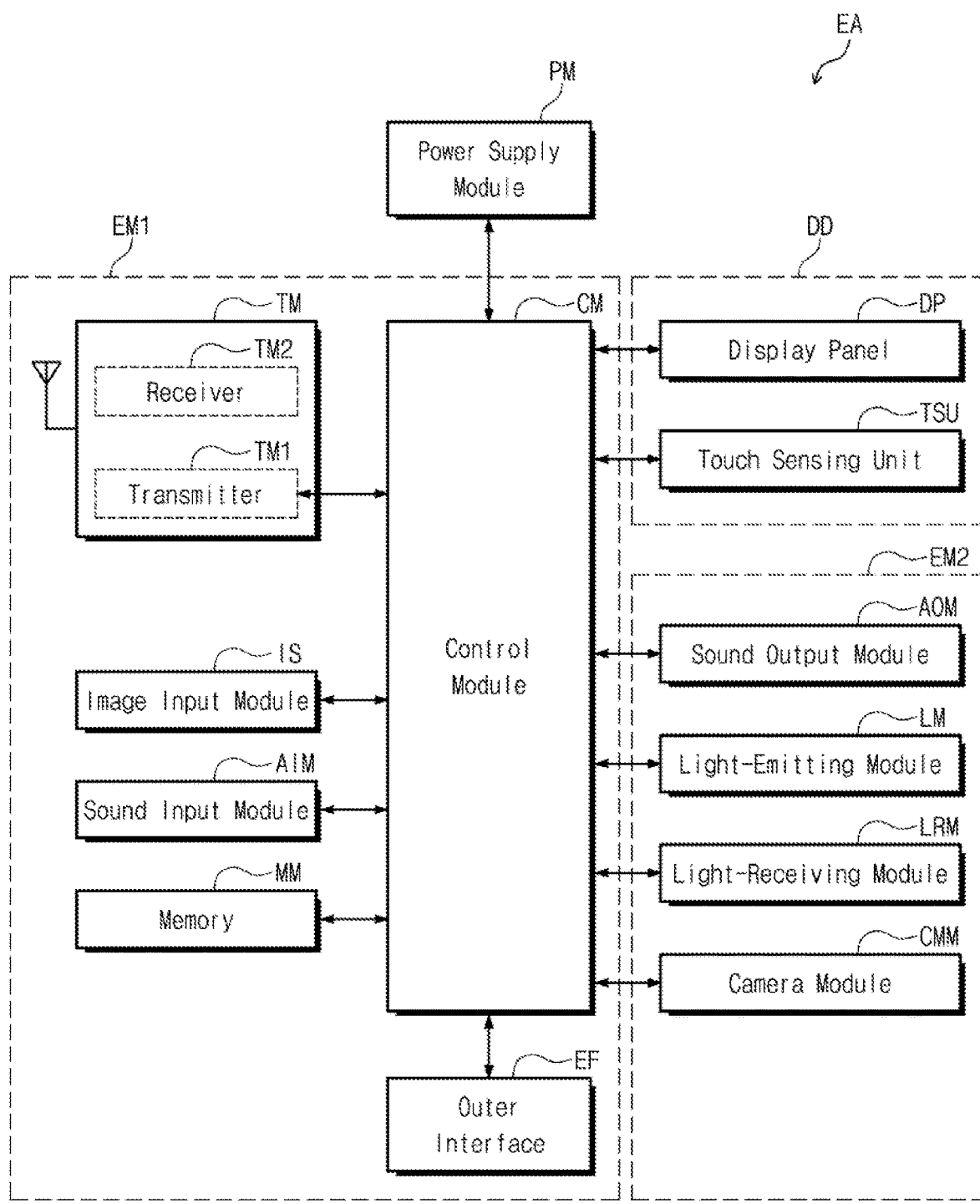
FIG. 4 illustrates a block diagram of the electronic device according to an embodiment.

FIG. 1 illustrates an embodiment of an electronic device EA, FIG. 2 illustrates an exploded perspective view of the electronic device according to one embodiment, FIG. 3 illustrates an embodiment of an equivalent circuit diagram of a pixel of a display panel included in the electronic device, and FIG. 4 illustrates a block diagram of the electronic device according to one embodiment.

Referring to FIGS. 1 and 2, electronic device EA may include a front surface that serves as a display surface to display an image IM. The display surface may be oriented in a plane defined by a first direction DR1 and a second direction DR2. The display surface may include a bezel region BZA adjacent to a transmission region TA.

The electronic device EA may display the image IM on the transmission region TA, which may be included in a window member WD. In FIG. 1, an internet search window is illustrated as an example of the image IM. The transmission region TA may have a predetermined (e.g., tetragonal or rectangular) shape, e.g., a shape with sides parallel to the first direction DR1 and the second direction DR2. The transmission region TA may have a different shape in another embodiment.

Hereinafter, a direction that is normal to the display surface will be referred to as a thickness direction or a third direction DR3 of the electronic device EA. In the present specification, a front (or top) surface and a rear (or bottom) surface of each element may be distinguished from each other based on the third direction DR3 or a display direction of the image IM. For example, the front and rear surfaces may be opposite surfaces facing each other in the third direction DR3. Also, directions indicated by the first to third directions DR1, DR2, and DR3 may be relative concept, and in certain embodiments may be used to indicate other directions. Hereinafter, first to third directions may be directions indicated by the first to third directions DR1, DR2, and DR3, respectively.

The electronic device EA may include a display panel DP, a window member WD, an electronic module ID, and a housing member HS. As shown in FIG. 4, the electronic device EA may further include a display module DD, a first electronic module EM1, a second electronic module EM2, and a power supply module PM. For convenience in illustration, some of elements illustrated in FIG. 4 are omitted from FIG. 2.

The display module DD may include a display panel DP and an input sensing unit TSU. The display panel DP may generate the image IM. The input sensing unit TSU may sense an externally applied user input. The user input may be generated, for example, based on a touch from a part of the body of a user, light, heat, or pressure.

The display panel DP may include a display region DA including a hole peripheral region PA and a peripheral region NDA. The display region DA may include a plurality of pixels PX that emit light to form the image IM. The peripheral region NDA may be adjacent to and enclose the display region DA. A driving circuit or a driver line for driving the display region DA may be included in the peripheral region NDA.

In one or more embodiments, at least a portion of the peripheral region NDA of the display panel DP may be curved or bent. For example, a portion of the peripheral region NDA max face the front surface of the electronic device EA and another portion of the peripheral region NDA may face a rear surface of the electronic device EA. In an embodiment, the peripheral region NDA may be omitted from the display panel DP. Also, in an embodiment, the display region DA may be overlapped with the transmission region TA and the peripheral region NDA may be overlapped with the bezel region BZA.

FIG. 3 illustrates an embodiment of an equivalent circuit diagram representative of the pixels PX in the display panel DP. Referring to FIG. 3, the pixel PX may be connected to a plurality of signal lines, e.g., a gate line GL, a data line DL, and a power line VDD. The pixel PX may also be coupled to one or more other signal lines in an embodiment.

The pixel PX may include a first transistor TR1, a capacitor CAP, a second transistor TR2, and an organic light emitting element ED. The first transistor TR1 may be a switching device that controls an on/off state of the pixel PX. The first transistor TR1 may transmit or block a data signal, which is transmitted through the data line DL, based on a gate signal transmitted through the gate line GL.

The capacitor CAP may be between and coupled to the first transistor TR1 and the power line VDD. The capacitor CAP may store an amount of charge corresponding to the difference in voltage level between the data signal transmitted from the first transistor TR1 and a first power voltage applied to the power line VDD.

The second transistor TR2 may be coupled to the first transistor TR1, the capacitor CAP, and the organic light emitting element ED. (In at least one embodiment, the term "coupled" may indicate a direct connection or an indirect connection, e.g., that there is at least one intervening element). The second transistor TR2 may control the driving current flowing through the organic light emitting element ED depending on the amount of electric charge stored in the capacitor CAP. The length of the turn-on period of the second transistor TR2 may be dependent, for example, on the amount of electric charge stored in the capacitor CAP. During the turn-on period, the second transistor TR2 may provide the first power voltage, which is transmitted through the power line VDD, to the organic light emitting element ED.

The organic light emitting element ED may be coupled to the second transistor TR2 and a power terminal VSS. The organic light emitting element ED may emit light with an intensity that is based on the difference in voltage level between a signal transmitted through the second transistor TR2 and a second power voltage received through the power terminal VSS. A light-emitting operation of the organic light emitting element ED may be executed during a turn-on period of the second transistor TR2.

The organic light emitting element ED may include a light-emitting material and may generate light having a color based on the light-emitting material. The color may be, for example, red, green, blue, white, or another color.

The hole peripheral region PA may be in the display region DA and adjacent to a module hole MH. In an embodiment, the hole peripheral region PA may enclose the module hole MH. As shown in FIG. 2, the hole peripheral region PA may be at a side region of the display region DA, but may be at a different region in another embodiment based, for example, on the position of the module hole MH.

The module hole MH may be overlapped with the hole peripheral region PA and the electronic module ID, in a plan view. The electronic module ID may be inserted into the module hole MH. In addition, the electronic module ID may be on a rear surface of the display panel DP adjacent to the module hole MH. Part of the electronic module ID may be externally exposed through the module hole MH. For example, only a lens, which is a part of a camera module CMM, may be externally exposed through the module hole MH. In an embodiment, the electronic module ID may be on a rear surface of the display panel DP and may be spaced apart from the display panel DP, when viewed in a sectional view.

In an embodiment, since the display panel DP includes the module hole MH formed in the display region DA, there is no need to provide an additional space for the electronic module ID in a region outside the display region DA. Thus, it may be possible to reduce the area for the peripheral region NDA and thus to reduce the size of the bezel of the electronic device EA. Furthermore, in the case where the electronic module ID is provided within the module hole MH, it may be possible to reduce the thickness of the electronic device EA.

The window member WD may be used to define the front surface of the electronic device EA. The window member WD may be on the front surface of the display panel DP to protect the display panel DP. For example, the window member WD may include a glass substrate, a sapphire substrate, or a plastic film. The window member WD may have a single- or multi-layered structure. In one embodiment, the window member WD may have a stacking structure including a plurality of plastic films which are coupled to each other by an adhesive layer, or may have a stacking structure including a glass substrate and a plastic film coupled to each other by an adhesive layer.

Since the window member WD includes a transparent material, the window member WD may correspond to the transmission region TA and the bezel region BZA of the electronic device EA. In the present embodiment, the transmission region TA may be a region corresponding to the display region DA. For example, the transmission region TA may be overlapped with the entire front surface of the display region DA or at least a region of the front surface of the display region DA. The image IM displayed on the display region DA of the display panel DP may be provided to a user through the transmission region TA.

The housing member HS may be coupled with the window member WD. The housing member HS may be provided to define the rear surface of the electronic device EA. The housing member HS may be coupled to the window member WD to define an internal space. The display panel DP, the electronic module ID, and several elements illustrated in FIG. 4 may be included in the internal space. The housing member HS may include a material having a relatively high strength. For example, the housing member HS may include a plurality of frames and/or plates, each of which is formed of at least one of glass, plastic, or metallic materials. The housing member HS may protect the elements of the electronic device EA, which are in the internal space, from an external impact.

Referring to FIG. 4, the power supply module PM may supply electric power to the electronic device EA using, for example, a typical battery module. The electronic module ID may include various functional modules used to operate the electronic device EA.

The electronic module ID may include the first electronic module EM1 and the second electronic module EM2. The first electronic module EM1 may be directly mounted on a motherboard that is electrically connected to the display module DD. In one embodiment, the first electronic module EM1 may be mounted on another substrate and may be electrically connected to the motherboard through a connector.

The first electronic module EM1 may include a control module CM, a wireless communication module TM, an image input module IS, a sound input module AIM, a memory MM, and an external interface EF. At least one of the modules may not be mounted on the motherboard and may be electrically connected to the motherboard through a flexible circuit board.

The control module CM may control overall operations of the electronic device EA. The control module CM may be, for example, a microprocessor. In an embodiment, the display module DD may be activated or deactivated under the control of the control module CM. The control module CM may control other modules (e.g., image input module IS or sound input module AIM) based on touch signals received from the display module DD.

The wireless communication module TM may transmit and receive a wireless signal to and from another terminal via a Bluetooth or a Wi-Fi line. The wireless communication module TM may transmit and receive a voice signal via a typical communication line. The wireless communication module TM may include a transmitter TM1 to modulate and transmit signals and a receiver TM2 to demodulate received signals.

The image input module IS may process an image signal and convert it to image data for display on the display module DD.

The sound input module AIM may receive an external sound signal (e.g., obtained by a microphone in a recording mode, a voice recognition mode, and so forth) and convert it to electrical voice data.

The memory MM may store data received from the wireless communication module TM, the image input module IS, and the sound input module AIM. The stored data may be used in a subsequent operation, for example, when output from the memory MM. Also, data for controlling the second electronic module EM2 may be stored in or removed from the memory MM.

The external interface EF may serve as an interface that is connected to an external charger, a wired/wireless data port, a card socket (e.g., a memory card or a SIM/UIM card), and so forth.

The second electronic module EM2 may include a sound output module AOM, a light-emitting module LM, a light-receiving module LRM, and a camera module CMM. The modules of the second electronic module EM2 may be directly mounted on a motherboard. In one embodiment, the modules of the second electronic module EM2 may be mounted on another substrate and may be electrically connected to the display module DD or the first electronic module EM1 through a connector.

The sound output module AOM may convert sound data, transmitted from the wireless communication module TM or stored in the memory MM, and output the converted sound data to an external device or system.

The light-emitting module LM may generate and emit light in one or more frequency ranges. In an embodiment, the light-emitting module LM may emit infrared light. The light-emitting module LM may include an LED device. The light-receiving module LRM may sense the infrared light. The light-receiving module LRM may be activated when an incident infrared light has an intensity higher than a reference value. The light-receiving module LRM may include a CMOS sensor. The infrared light emitted from the light-emitting module LM may be reflected by an external object (e.g., finger or face) and may be incident on the light receiving module LRM. The camera module CMM may be used to obtain an image of the external object.

The electronic module ID of FIG. 2 may be or include at least one of the elements of the second electronic module EM2. In this case, one or more other elements of the first electronic module EM1 and the second electronic module EM2 may be disposed at other positions. For example, the electronic module ID may include at least cane of the sound output module AOM, the light-emitting module LM, the light-receiving module LRM, and the camera module CMM.

Figure 5A:
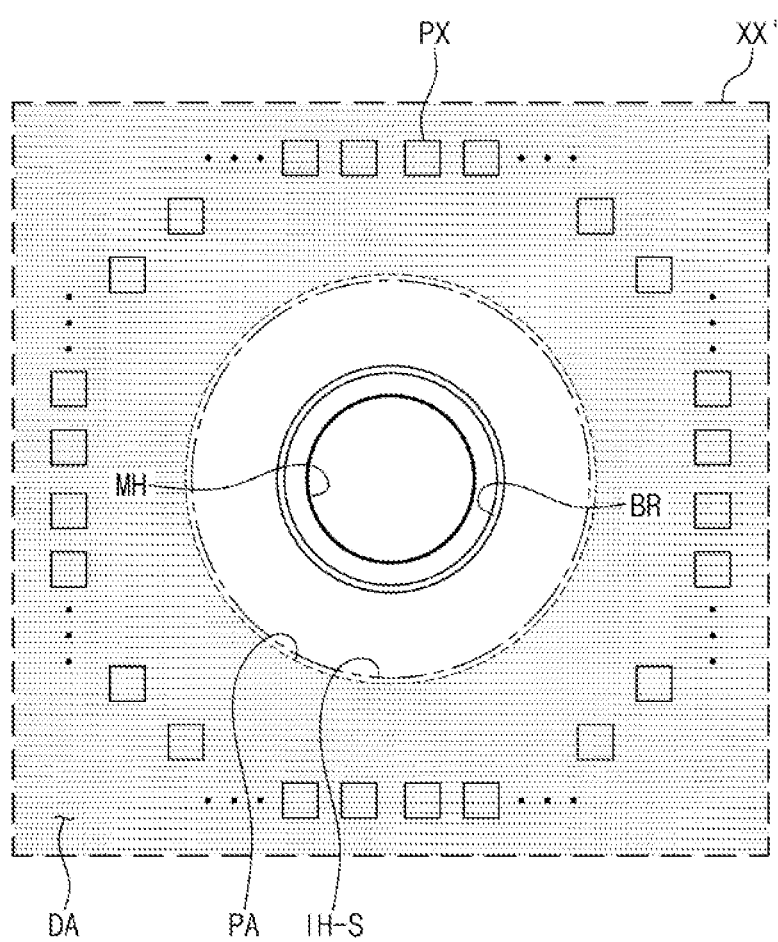
FIG. 5A illustrates an enlarged view of a region XX' of FIG. 2.
Figure 5B:
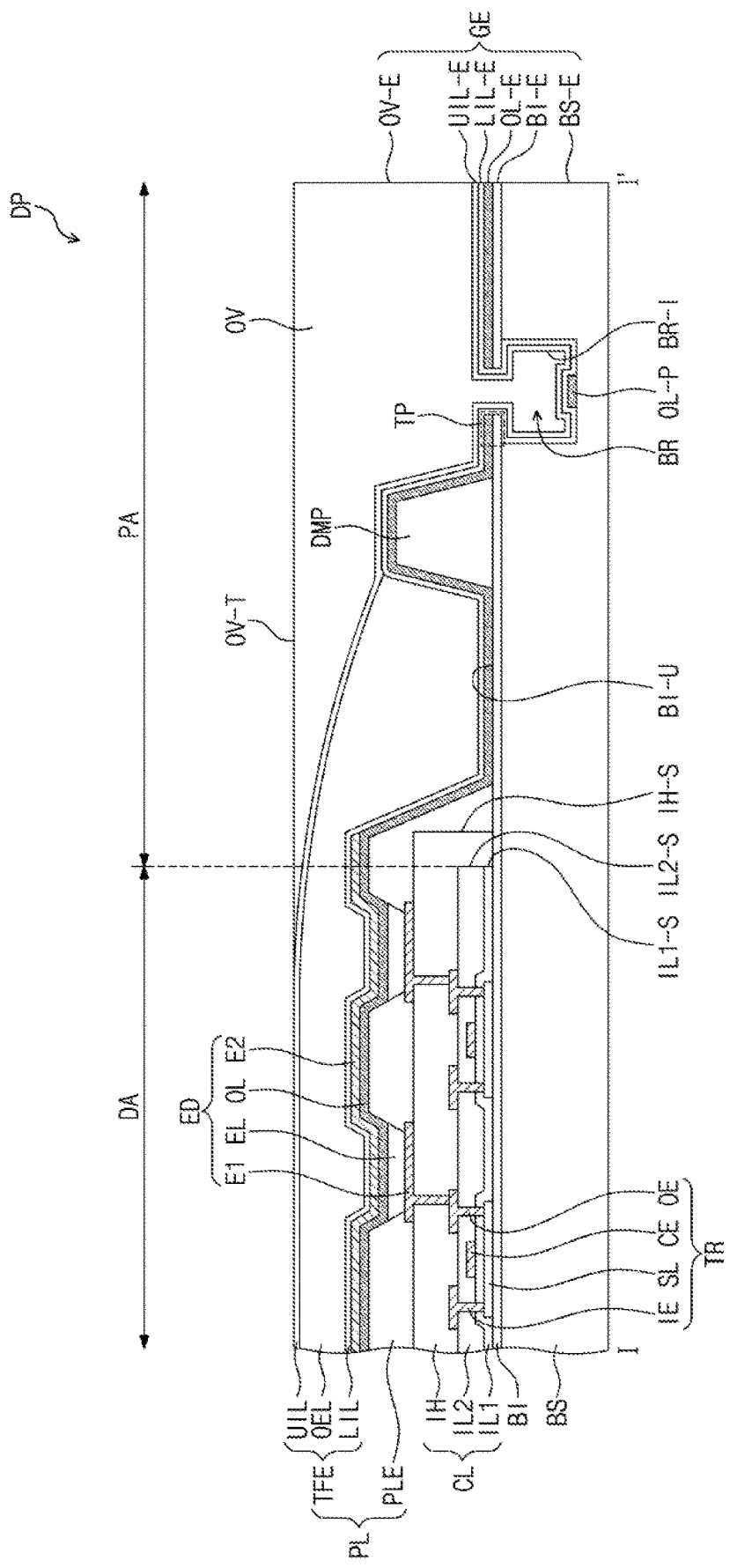
FIG. 5B illustrates a sectional view of a region of a display panel.
Figure 5C:
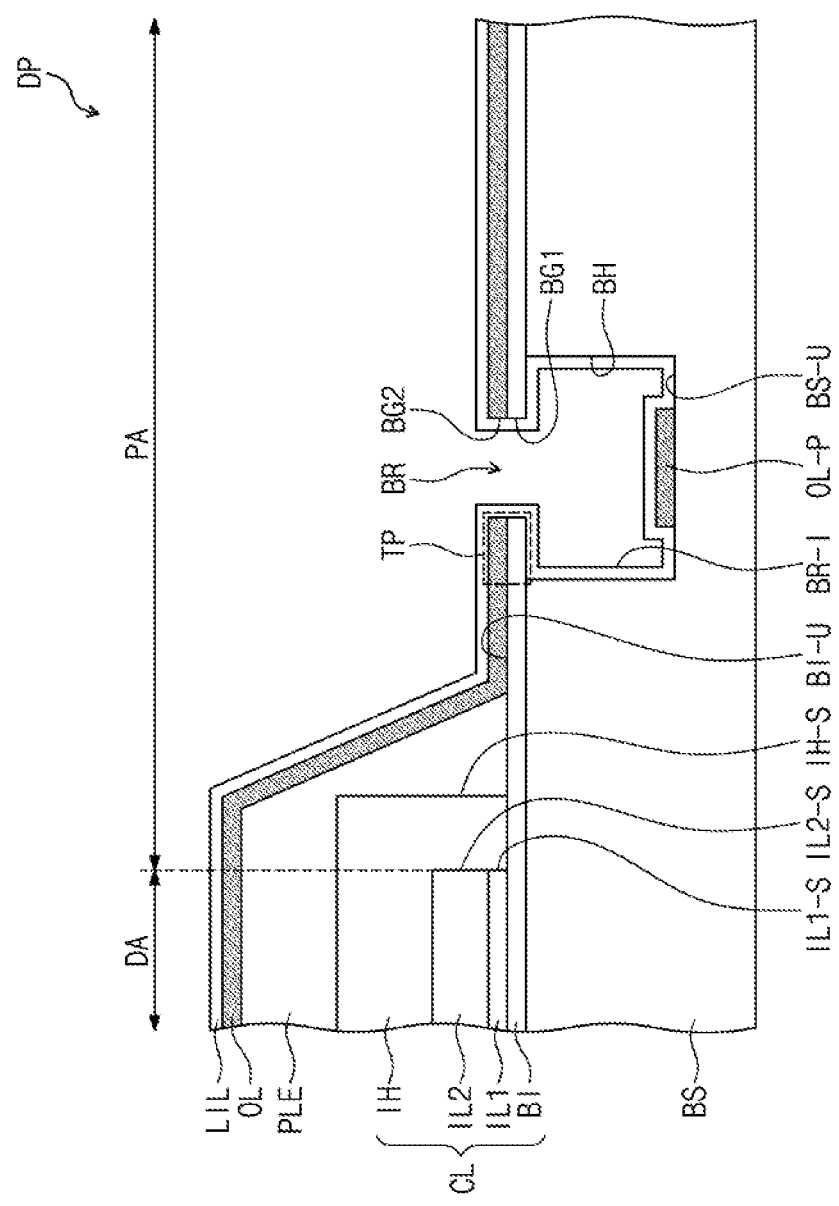
FIG. 5C illustrates a sectional view of a display panel according to various embodiments.

FIG. 5A illustrates an enlarged view of region XX' of FIG. 2 according to an embodiment. FIG. 5B illustrates a sectional view of at least a portion of the region XX' of the display according to an embodiment. FIG. 5C illustrates a sectional view of at least a portion of the region XX' in the display panel according to an embodiment. The same reference numbers in FIGS. 1 to 4 may be used to denote the same features in FIGS. 5A, 5B, and 5C.

Referring to FIGS. 5A and 5B, the hole peripheral region PA may be in the display region DA and may be enclosed or surrounded by the display region DA in the display region DA. The hole peripheral region PA may include the module hole MH and a groove BR. In an embodiment, the hole peripheral region PA may enclose or surround the groove BR and, for example, may have a circular or elliptical shape.

The groove BR may be overlapped with the hole peripheral region PA, when viewed in a plan view. The groove BR may be in the hole peripheral region PA. In an embodiment, the groove BR may enclose or surround the module hole MH and, for example, may have a circular or elliptical shape. The groove BR may be between the module hole MH and the hole peripheral region PA and may have a dosed loop shape enclosing the module hole MH.

The module hole MH may be overlapped with the hole peripheral region PA, when viewed in a plan view. The module hole MH may be in the hole peripheral region PA and may be enclosed by the groove BR. In an embodiment, the module hole MH may have, for example, a circular or elliptical shape. The hole peripheral region PA, the groove BR, and/or the module hole MH may have different shapes in another embodiments, which shapes may be the same or different from one another.

The display panel DP may include a base substrate BS, a barrier layer BI, a circuit layer CL, and a device layer PL. The circuit layer CL may be on the barrier layer BI, and the device layer PL may be on the circuit layer CL.

The base substrate BS may include a glass substrate, a metal substrate, and a flexible plastic substrate. In one embodiment, the base substrate BS may include a base layer including an organic material. For example, the organic material of the base substrate BS may include polyimide, polyethylene naphthalate, polyethylene terephthalate, polyarylate, polycarbonate, polyetherimide or polyethersulfone. The base substrate BS may be rigid or flexible or may be a different type of substrate according to various embodiments The barrier layer BI may be on the base substrate BS and may cover the base substrate BS. The barrier layer BI may be an insulating layer including an inorganic material. For example, the barrier layer BI may be firmed of or include at least one of aluminum oxide ($AlO_x$), titanium oxide ($TiO_x$), silicon oxide ($SiO_x$), silicon oxynitride ($SiO_xN_y$), zirconium oxide ($ZrO_x$), or hafnium oxide ($HfO_x$). The barrier layer BI may be formed of or include a plurality of inorganic layers. The barrier layer BI may prevent an external material from pass therethrough.

The display panel DP may further include a buffer layer, which, for example, may be on the barrier layer BI. The buffer layer may include an inorganic material or an organic material. The buffer layer may be greater than the barrier layer BI in terms of an adhesion strength to a semiconductor pattern SL or a first insulating layer IL1 to be described below. Thus, the circuit layer CL may be stably formed on the base substrate BS.

The circuit layer CL may include a transistor TR and a plurality of insulation layers IL1, IL2, and IH. The circuit layer CL may be on the base substrate BS. The transistor TR may include a semiconductor pattern SL, a control electrode CE, an input electrode IE, and an output electrode OE. The control electrode CE may control flow of current in the semiconductor pattern SL and may selectively output an electrical signal, input from the input electrode IE, to the output electrode OE. FIG. 5B illustrates transistor TR, which is one of the transistors TR1 and TR2 of FIG. 3 (for example, is used as a driving transistor).

The semiconductor pattern SL may be on the base substrate BS and may include at least one of crystalline semiconductor materials, metal oxide semiconductor materials, poly silicon, or amorphous silicon. The control electrode CE of the transistor TR is illustrated to be on the semiconductor pattern SL, but may be on the base substrate BS or a different layer in another embodiment and may be covered with the first inorganic layer IL1. The semiconductor pattern SL may be on the first inorganic layer IL1. For example, the transistor TR may have a bottom-gate structure.

The first inorganic layer IL1 may be between the semiconductor pattern SL and the control electrode CE. The first inorganic layer IL1 may cover the base substrate BS and the semiconductor pattern SL. The first inorganic layer IL1 may be formed of or include an inorganic material, but may include a different material in another embodiment.

The control electrode CE may be on the semiconductor pattern SL and may be spaced apart from the semiconductor pattern SL, with first inorganic layer IL1 therebetween. The control electrode CE may be overlapped with the semiconductor pattern SL.

The second inorganic layer IL2 may be between the control electrode CE and the input electrode IE and between the control electrode CE and the output electrode OE. The second inorganic layer IL2 may cover the first inorganic layer IL1 and the control electrode CE. The second inorganic layer IL2 may be formed of or include an inorganic material, but may include a different material in another embodiment.

The input electrode IE and the output electrode OE may be on the second inorganic layer IL2. The input electrode IE and the output electrode OE may penetrate the first and second inorganic layers IL1 and IL2 and may be coupled to two opposite portions of the semiconductor pattern SL, respectively. In an embodiment, the input electrode IE and the output electrode OE may be directly coupled to the semiconductor pattern SL.

An organic layer IH may be on the second inorganic layer IL2 and may cover the transistor TR. The organic layer IH may be between the transistor TR and the device layer PL to electrically disconnect the transistor TR from the device layer PL.

The device layer PL may include a pixel definition layer PLE, the organic light emitting element ED, and an encapsulation layer TFE. The pixel definition layer PLE may be on the organic layer IH. A plurality of openings may be defined in the pixel definition layer PLE. The organic light emitting element ED may be provided in each of the openings.

The organic light emitting element ED may include a first electrode E1, a second electrode E2, a light emitting layer EL, and a charge control layer OL. The first electrode E1 may be on the organic layer IH. The first electrode E1 may pass through the organic layer IH and may be electrically connected to the transistor TR. In an embodiment, a plurality of the first electrodes E1 may be provided. At least a portion of each of the first electrodes E1 may be exposed by a corresponding one of the openings in the pixel definition layer PLE.

The second electrode E2 may be on the first electrode E1 and may cover at least a portion of the pixel definition layer PLE. In one embodiment, the second electrode E2 may be extended to the hole peripheral region PA to cover the hole peripheral region PA.

The second electrodes E2 of the organic light emitting elements ED may be coupled to each other to form a single continuous object. The organic light emitting elements ED may be applied with the same voltage through the common second electrode E2. In this case, an additional patterning process for forming the second electrode E2 may be omitted. In one embodiment, a plurality of the second electrodes E2 spaced apart from each other may be provided to correspond to the openings, respectively.

The second electrode E2 may include a transmissive electrode which is optically transparent. For example, the second electrode E2 may be formed of or include at least one of indium zinc oxide (IZO), indium tin oxide (ITO), indium gallium oxide (IGO), indium zinc gallium oxide (IGZO), mixtures thereof, or compounds thereof. Thus, an image may be displayed on the front surface of the display panel DP. In one embodiment, the second electrode E2 may include a reflective or transflective electrode, for example, depending on the display direction of an image.

The light emitting layer EL may be between the first electrode E1 and the second electrode E2. In an embodiment, a plurality of the light emitting layers EL may be in the openings, respectively. In the organic light emitting element ED, the potential difference between the first electrode E1 and the second electrode E2 may be adjusted to activate the light emitting layer EL or to cause a light emitting operation of the light emitting layer EL.

The charge control layer OL may be between the first electrode E1 and the second electrode E2. The charge control layer OL may be adjacent to the light emitting layer EL. In the present embodiment, the charge control layer OL may be between the light emitting layer EL and the second electrode E2, as shown. In one embodiment, the charge control layer OL may be between the light emitting layer EL and the first electrode E1 or may include a plurality of layers which are stacked in the third direction DR3, with the light emitting layer EL therebetween.

The charge control layer OL may be formed without an additional patterning process, and thus the charge control layer OL may be a single pattern overlapped with the front surface of the base substrate BS. The charge control layer OL may be in not only a region provided with the pixel definition layer PLE but also other regions. The charge control layer OL may be used to control motion of electrons and thereby to improve light-emitting efficiency of the display panel DP. The charge control layer OL may include an electron transport layer and an electron injection layer.

The encapsulation layer TFE may be on the organic light emitting element ED. The encapsulation layer TFE may be formed of or include an inorganic layer and/or an organic layer. In the present embodiment, the encapsulation layer TFE may include a first inorganic encapsulation layer LIL, an organic encapsulation layer OEL, and a second inorganic encapsulation layer UIL.

The first inorganic encapsulation layer LIL may be on the device layer PL and may the charge control layer OL, which is disposed on the front surface of the base substrate BS. The first inorganic encapsulation layer LIL may be in contact with the charge control layer OL. The second inorganic encapsulation layer UIL may be on the first inorganic encapsulation layer LIL. The first inorganic encapsulation layer LIL and the second inorganic encapsulation layer UIL may seal or encapsulate the organic encapsulation layer OEL. Each of the first inorganic encapsulation layer LIL and the second inorganic encapsulation layer UIL may be formed of or include an inorganic material. For example, each of the first inorganic encapsulation layer LIL and the second inorganic encapsulation layer UIL may be formed of or include at least one of aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), or zinc oxide ($ZnO_x$).

The organic encapsulation layer OEL may be between the first inorganic encapsulation layer LIL and the second inorganic encapsulation layer UIL. The organic encapsulation layer OEL may be formed of or include an organic material. For example, the organic encapsulation layer OEL may be formed of or include at least one of epoxy, polyimide, polyethylene terephthalate, polycarbonate, polyethylene, or polyacrylate.

The first inorganic encapsulation layer LIL and the second inorganic encapsulation layer UIL may be on the front surface of the display panel DP and may have a single object shape, when viewed in a plan view. Each of the first inorganic encapsulation layer LIL and the second inorganic encapsulation layer UIL may be partially overlapped with the organic encapsulation layer OEL. Thus, in a region, the first inorganic encapsulation layer LIL and the second inorganic encapsulation layer UIL may be spaced apart from each other, with the organic encapsulation layer OEL therebetween in the third direction DR3. In another region, the first inorganic encapsulation layer LIL and the second inorganic encapsulation layer UIL may be in direct contact with each other in the third direction DR3. The encapsulation layer TFE may seal or encapsulate the organic light emitting element ED and may protect the organic light emitting element ED from an external contamination material.

The display panel DP may further include a dam portion DMP disposed near a border between the display region DA and the hole peripheral region PA and may extend along an edge adjacent to the hole peripheral region PA. The dam portion DMP may enclose the display region DA or may be adjacent to a portion (e.g., a pad or a driving circuit) of the display region DA. In an embodiment, the dam portion DMP may have a single-layered structure, but may have a multi-layered structure in another embodiment. The multi-layered structure may include the same material as at least one of the insulation layers IL1, IL2, and IH or the pixel definition layer PLE.

In an embodiment, a liquid organic material may be supplied to form the organic encapsulation layer OEL. During the formation of the organic encapsulation layer OEL, the dam portion DMP may be used to delimit a spreading boundary of the liquid organic material. The organic encapsulation layer OEL may be formed by coating the first inorganic encapsulation layer LIL with a liquid organic material using an inkjet method. The dam portion DMP may prevent the liquid organic material from overflowing outside of the dam portion DMP, thereby delimiting the spread boundary of the liquid organic material.

In an embodiment, the display panel DP may further include a planarization layer OV. At least a portion of the planarization layer OV may be on the second inorganic encapsulation layer UIL and may provide a flat surface OV-T, along with the second inorganic encapsulation layer UIL. The planarization layer OV may cover the front surface of the hole peripheral region PA. In an embodiment, the planarization layer OV may be formed of or include the same material as the organic encapsulation layer OEL.

The module hole MH may be overlapped with the hole peripheral region PA and may be in the hole peripheral region PA. The module hole MH may penetrate the base substrate BS. In one embodiment, the module hole MH may be formed to penetrate the base substrate BS, the barrier layer BI, the charge control layer OL, the first inorganic encapsulation layer LIL, and the second inorganic encapsulation layer UIL.

The module hole MH may penetrate the display panel DP. In this case, some of elements of the display panel DP may have ends defined by the module hole MH. For example, the module hole MH may be formed to expose an end portion BS-E of the base substrate BS, an end portion BI-E of the barrier layer BI, an end portion OL-E of the charge control layer OL, an end portion LIL-E of the first inorganic encapsulation layer LIL, an end portion UIL-E of the second inorganic encapsulation layer UIL, and an end portion OV-E of the planarization layer OV. The end portions may define an inner surface GE of the module hole MH. The end portion BS-E of the base substrate BS, the end portion BI-E of the barrier layer BI, the end portion OL-E of the charge control layer OL, the end portion LIL-E of the first inorganic encapsulation layer LIL, the end portion UIL-E of the second inorganic encapsulation layer UIL, and the end portion OV-E of the planarization layer OV constituting the inner surface GE may be aligned with each other.

The groove BR may be overlapped with the hole peripheral region PA and may be a recessed region of the base substrate BS, which is partially recessed from a top surface BI-U of the barrier layer BI and covered with at least one of the first inorganic encapsulation layer LIL and the second inorganic encapsulation layer UIL.

FIG. 5C illustrates an example in which the groove BR is adjacent to a side portion IL1-S of the first inorganic layer IL1 and a side portion IL2-S of the second inorganic layer IL2. Referring to FIG. 5C, the base substrate BS may include a recessed region BH, which is overlapped with the hole peripheral region PA and which is formed by recessing a portion of the base substrate BS. The barrier layer BI may include a first opening BG1, which is overlapped with the hole peripheral region PA and which is formed to penetrate the barrier layer BI. The charge control layer OL may include a second opening BG2, which is overlapped with the hole peripheral region PA and which is formed to penetrate the charge control layer OL. The recessed region BH, the first opening BG1, and the second opening BG2 may be overlapped with each other, when viewed in a plan view.

The groove BR may be formed by at least one of the first inorganic encapsulation layer LIL and the second inorganic encapsulation layer UIL covering an inner surface of each of the recessed region BH, the first opening BG1, and the second opening BG2. Thus, an internal space BR-I may be defined in the groove BR. The internal space BR-I may be an under-cut shaped region, which is formed in a process of etching the inorganic layers IL1 and IL2 and the base substrate BS. The groove BR may be provided by covering the under-cut shaped internal space BR-I with at least one of the first inorganic encapsulation layer LIL or the second inorganic encapsulation layer UIL. In an embodiment, the internal space BR-I of the groove BR may be filled with the planarization layer OV, as shown in FIG. 5B.

In an embodiment, when viewed in a plan view, a tip portion TP may be defined by the barrier layer BI and the charge control layer OL covering a portion of the base substrate BS overlapped with the groove BR. In an embodiment, the tip portion TP may include a portion of each of the barrier layer BI and the charge control layer OL. In one embodiment, in the case where the charge control layer OL is not formed on the front surface of the base substrate BS, the charge control layer OL may be omitted from the tip portion TP In an embodiment, since the groove BR is near the module hole MH, it may be possible to block a penetration path of moisture and oxygen moving from the module hole MH. Thus, it may be possible to realize a display panel DP with improved reliability. In addition, since the planarization layer OV is in the groove BR to support the tip portion TP, it may be possible to improve an impact-resistant property of the display panel DP.

In the case where the tip portion TP includes the plurality of inorganic layers, which are a part of the under-cut shaped structure, a delamination phenomenon may occur between the inorganic layers of the tip portion TP. When a delamination phenomenon occurs between the inorganic layers of the tip portion TP, external moisture and oxygen may enter the circuit layer CL and the device layer PL and deteriorate reliability of the display panel DP.

In an embodiment, at least one of the insulation layers IL1, IL2, and IH in the circuit layer CL may be spaced apart from the groove BR, when viewed in a plan view, and may be covered with the organic layer IH. For example, each of the side portions IL1-S and IL2-S of the first and second inorganic layers IL1 and IL2 may be spaced apart from the groove BR, when viewed in a plan view. Each of the side portions IL1-S and IL2-S of the first and second inorganic layers IL1 and IL2 may enclose the groove BR and may have a closed loop shape, when viewed in a plan view. In an embodiment, each of the side portions IL1-S and IL2-S of the first and second inorganic layers IL1 and IL2 may be covered with the organic layer IH.

In an embodiment, the border between the display region DA and the hole peripheral region PA may be defined by a side portion, which is most adjacent to the groove BR, among the side portions IL1-S and IL2-S of the first and second inorganic layers IL1 and IL2. The boundary of the hole peripheral region PA (for example, depicted by the solid line in FIG. 5A) may be defined by at least one of the side portions IL1-S and IL2-S of the first and second inorganic layers IL1 and IL2. A side portion IH-S of an organic layer between the groove BR and the hole peripheral region PA is illustrated in FIG. 5A.

The barrier layer BI may not be overlapped with the first and second inorganic layers IL1 and IL2, on the hole peripheral region PA. Thus, on the hole peripheral region PA, a portion of the top surface BI-U of the barrier layer BI may be exposed from the first and second inorganic layers IL1 and IL2.

In an embodiment, since each of the side portions IL1-S and IL2-S of the first and second inorganic layers IL1 and IL2 is spaced apart from the groove BR, inorganic layers (e.g., first and second inorganic layers IL1 and IL2) in the circuit layer CL may be omitted from the tip portion TP. Thus, it may be possible to simplify the inorganic layers disposed in the lip portion TP, prevent or reduce the chances of the delamination phenomenon occurring in the tip portion TP, and thereby improve the reliability of the display panel DP.

In addition, since side portions IL1-S and IL2-S of the inorganic layers IL1 and IL2 in the display region DA are covered with the organic layer IH, the delamination phenomenon of the inorganic layers IL1 and IL2 may be improved.

In an embodiment, an additional pattern portion OL-P may be further provided on a top surface BS-U of the base substrate BS overlapped with the groove BR. The additional pattern portion OL-P may cover at least a portion of the top surface BS-U of the base substrate BS. The additional pattern portion OL-P may be formed by a process of depositing the charge control layer OL, after the formation of the groove BR. In the present embodiment, the additional pattern portion OL-P is described to contain the same material as the charge control layer OL. If a deposition material is used for the deposition process of the organic light emitting element ED, it may also be used for the additional pattern portion OL-P. For example, the additional pattern portion OL-P may be formed of or include at least one of organic materials and metal materials.

Figure 6:
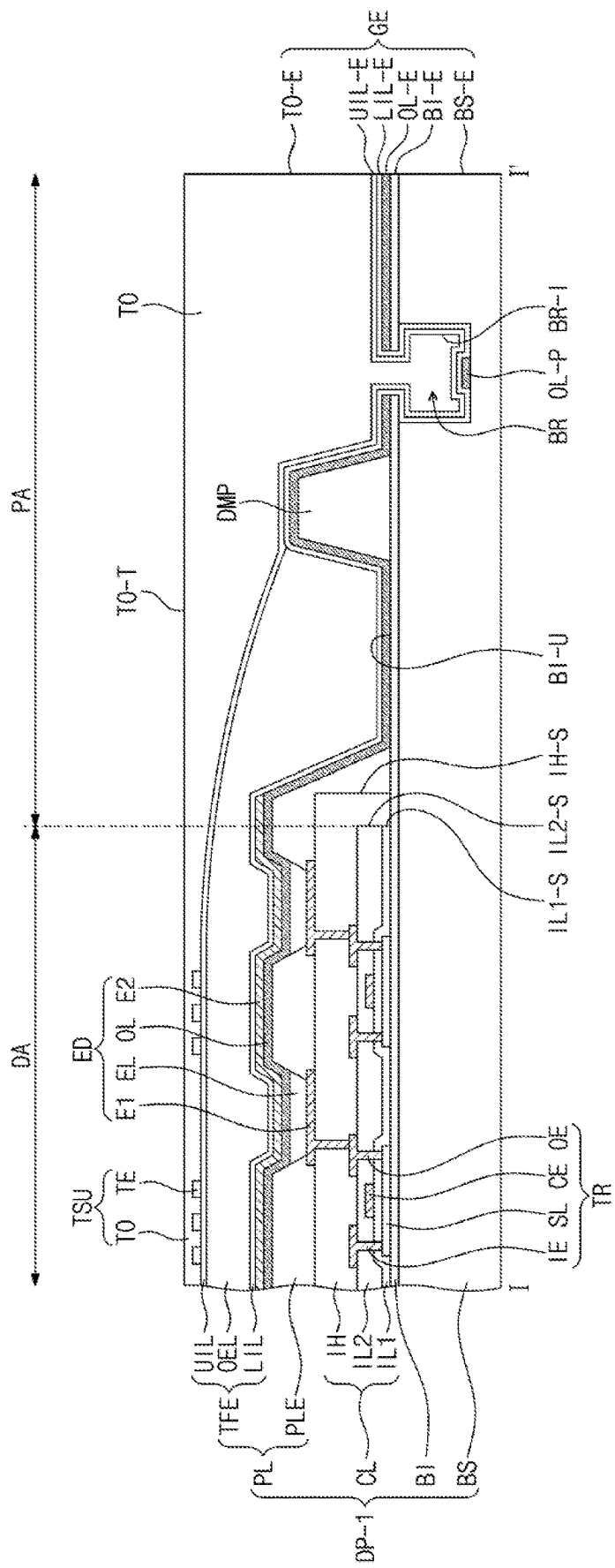
FIG. 6 illustrates a sectional view of an embodiment of a region of a display panel.

FIG. 6 illustrates a sectional view of a region of a display panel according to an embodiment. For concise description, the same reference numerals may be used in FIGS. 1 to 5C to denote the same features.

Referring to FIG. 6, according to an embodiment, the input sensing unit TSU may be directly disposed on a display panel DP-1. In one embodiment, the input sensing unit TSU may be provided as an additional element and may be coupled to the display panel DP-1, with an adhesion layer therebetween.

The input sensing unit TSU may include a sensing electrode TE on the display region DA, sensing signal lines on the peripheral region NDA, and an organic sensing layer TO covering the sensing electrode TE and the sensing signal lines. In an embodiment, the sensing electrode TE may be spaced apart from the organic light emitting element ED, when viewed in a plan view.

In an embodiment, the input sensing unit TSU may have a multi- or single-layered structure. The input sensing unit TSU may be configured to sense an external input in a mutual-capacitance manner and/or in a self-capacitance manner.

In an embodiment, the organic sensing layer TO may be on the hole peripheral region PA and the display region DA. In the hole peripheral region PA, the internal space BR-I may be filled with the organic sensing layer TO. The organic sensing layer TO may be on the display region DA and the hole peripheral region PA and may have a flat surface TO-T. Thus, an end portion TO-E of the organic sensing layer TO may be in the module hole MH. In an embodiment, by replacing the planarization layer OV of FIG. 5B with the organic sensing layer TO in a process of forming the input sensing unit TSU, it may be possible to reduce process cost and time in the process.

Figure 7A:
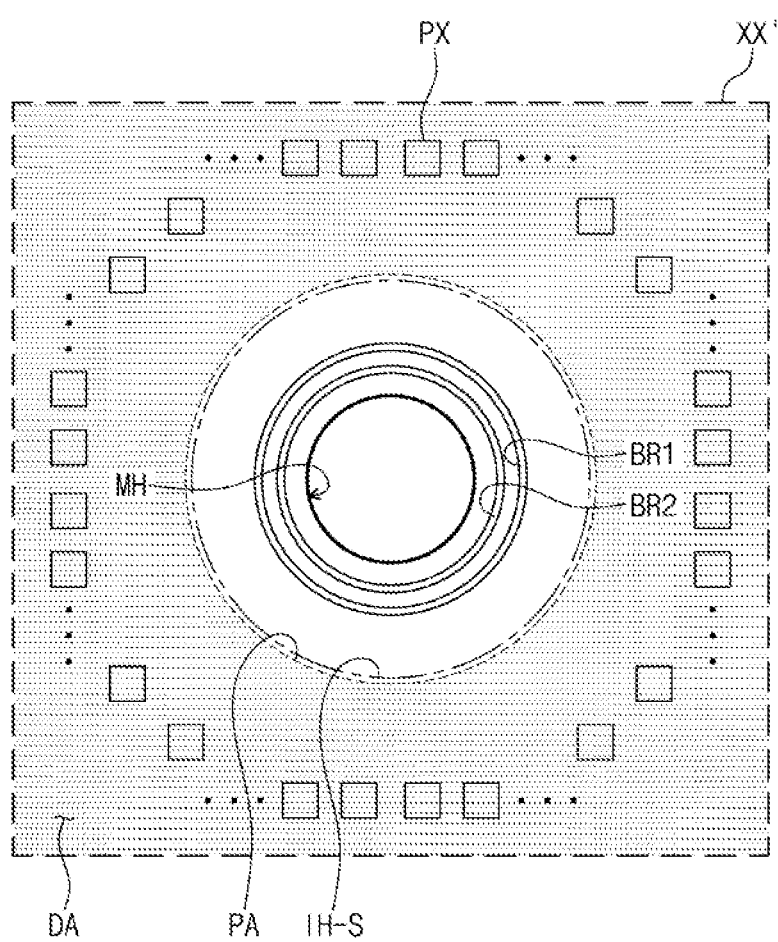
FIG. 7A illustrates an enlarged view of region XX' of FIG. 2.
Figure 7B:
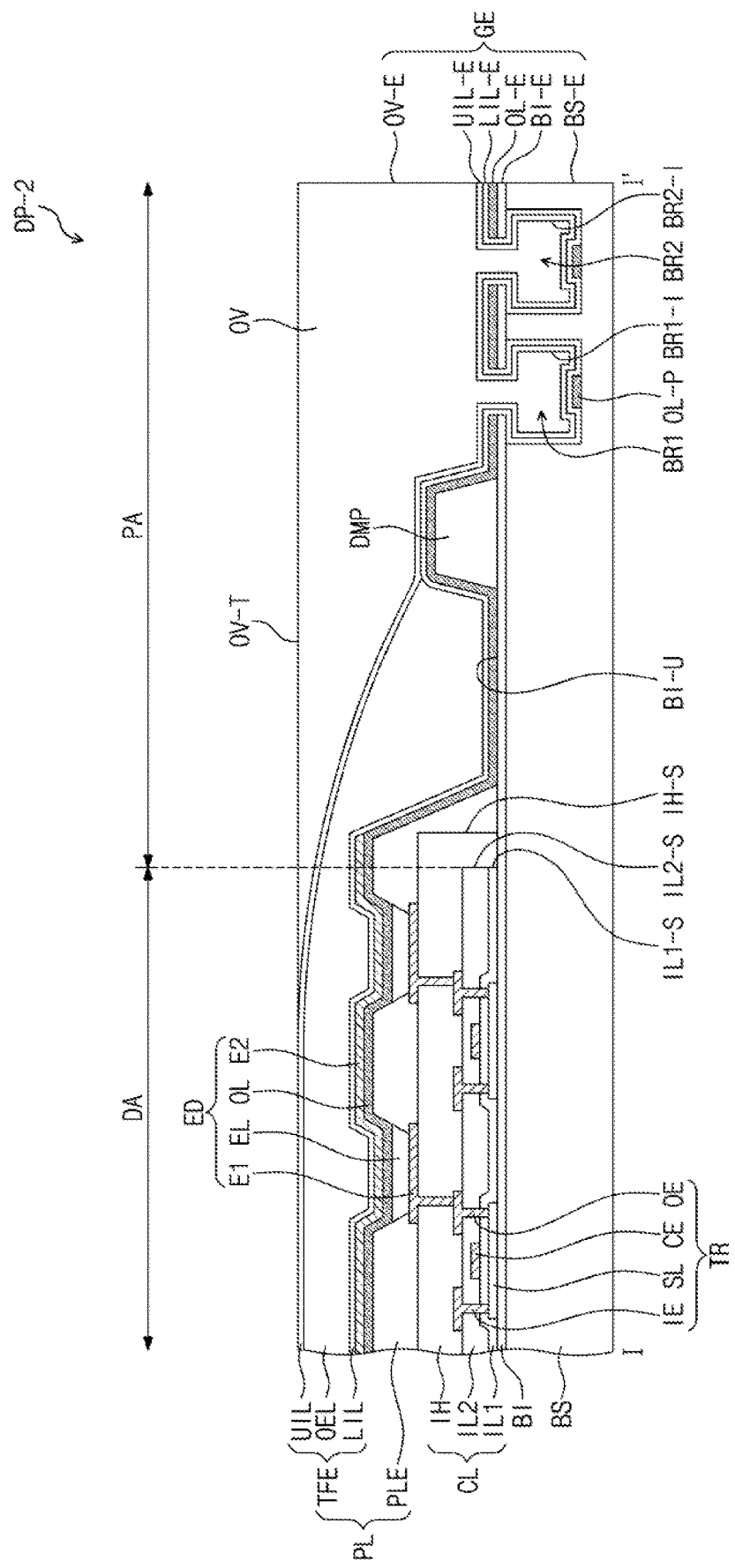
FIG. 7B illustrates a sectional view illustrating a region of a display panel according to various embodiments.

FIG. 7A illustrates an enlarged view of region XX' of FIG. 2 according to an embodiment. FIG. 7B illustrates a sectional view of a region of a display panel according to an embodiment. The same reference numbers are used in FIGS. 1 to 5B to denote the same features.

Referring to FIG. 7A, according to an embodiment of the inventive concept, a display panel DP-2 may include a first groove BR1 and a second groove BR2. The first groove BR1 may be between the hole peripheral region PA and the module hole MH. The second groove BR2 may be between the first groove BR1 and the second groove BR2.

Referring to FIG. 7B, the first and second grooves BR1 and BR2 may be spaced apart from the side portions IL1-S and IL2-S of the first and second inorganic layers IL1 and IL2. Each of the first and second grooves BR1 and BR2 may be a recessed region of the base substrate BS, which is partially recessed from a top surface BI-S of the barrier layer BI and is covered with at least one of the first inorganic encapsulation layer LIL and the second inorganic encapsulation layer UIL. The first groove BR1 may provide a first internal space BR1-I, and the second groove BR2 may provide a second internal space BR2-I. Each of the internal spaces BR1-I and BR2-I may be filled with the planarization layer OV.

Since the display panel DP-2 includes a plurality of grooves BR1 and BR2 between the module hole MH and the side portions IL1-S and IL2-S of the inorganic layers, a penetration path of oxygen and moisture entering from the module hole MH may be effectively prevented. Thus, it may be possible to improve reliability of display panel DP-2.

Figure 8A:
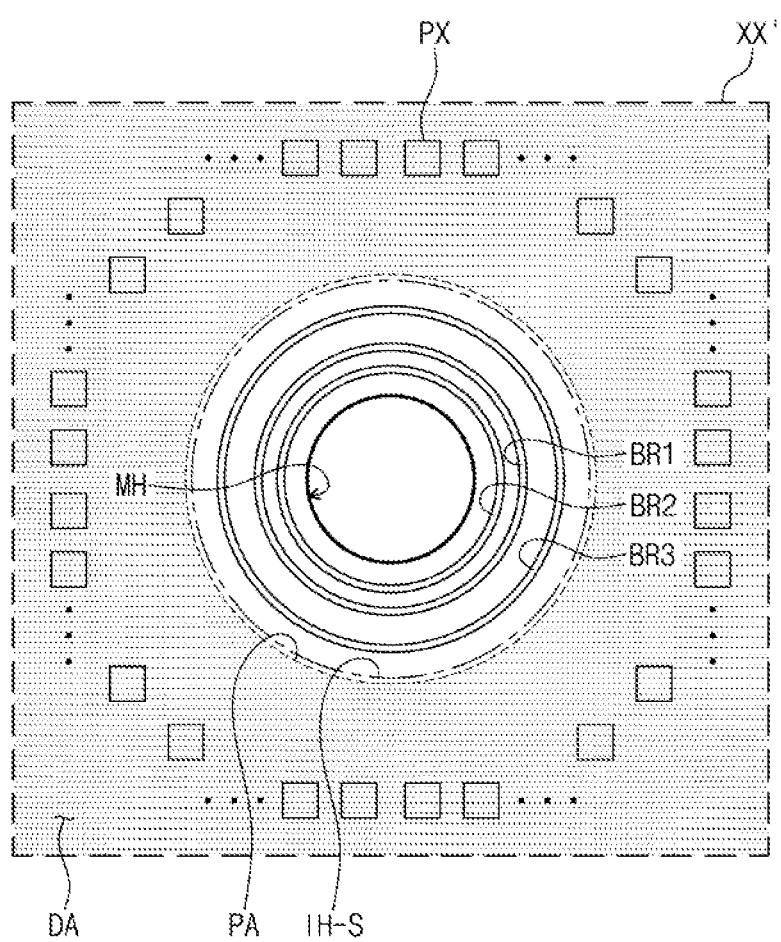
FIG. 8A illustrates an enlarged view of region XX' of FIG. 2.
Figure 8B:
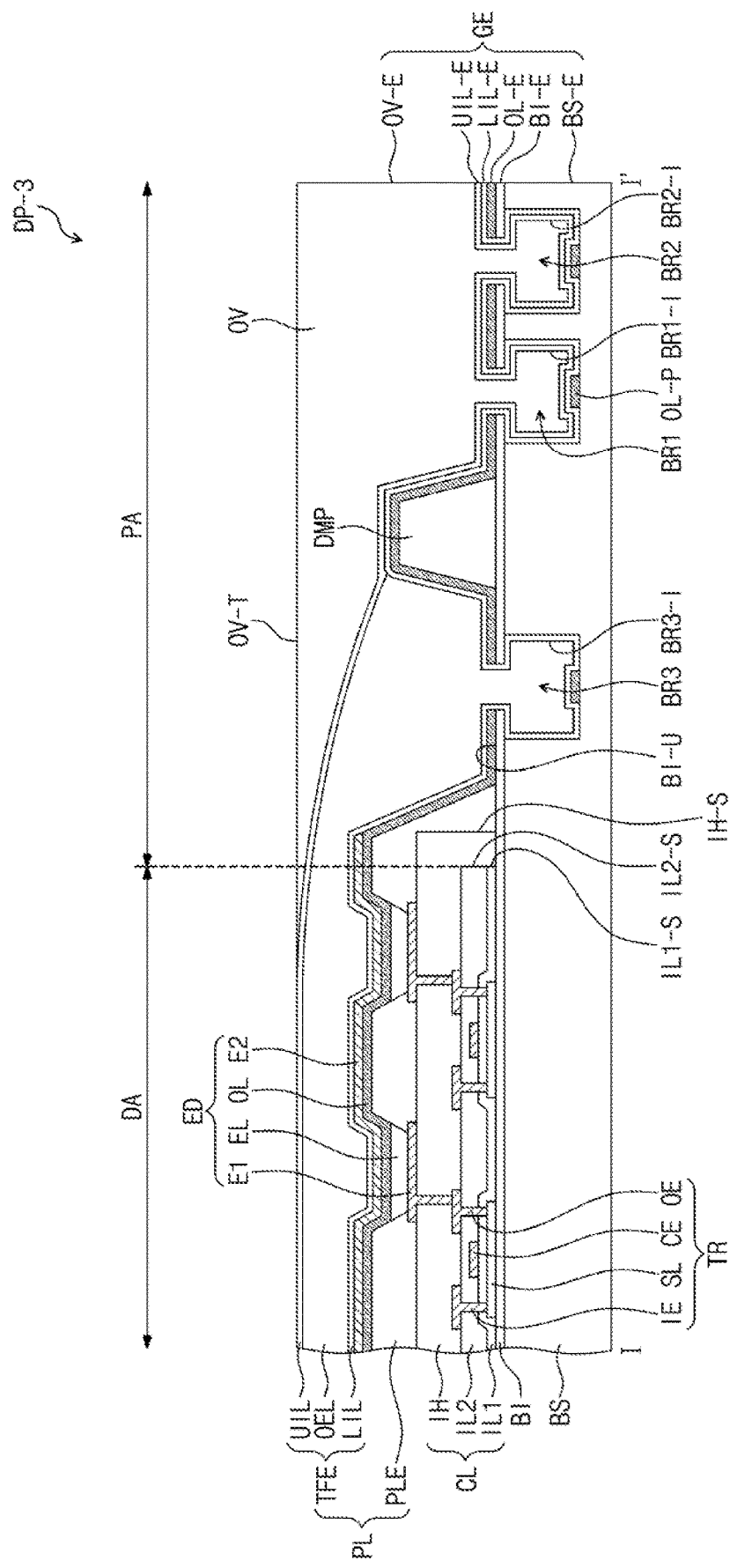
FIG. 8B illustrates a sectional view of a region of a display panel according to various embodiments.

FIG. 8A illustrates an enlarged view of a region XX' of FIG. 2 according to an embodiment. FIG. 8B illustrates a sectional view of a region of a display panel according to an embodiment. For concise description, the same reference numbers are used in FIGS. 1 to 7B to denote the same features.

Referring to FIGS. 8A and 8B, the display panel DP-3 may include a first groove BR1, a second groove BR2, and a third groove BR3. The first groove BR1 may be between the hole peripheral region PA and the module hole MH. The second groove BR2 may be between the first groove BR1 and the second groove BR2. The first groove BR1 and the second groove BR2 may correspond to the grooves shown in FIG. 7B.

The third groove BR3 may be spaced apart from the first groove BR1, with the dam portion DMP therebetween. The third groove BR3 may be a recessed region of the base substrate BS, which is partially recessed from the top surface BI-S of the barrier layer BI and which is covered with the first inorganic encapsulation layer LIL. The third groove BR3 may be spaced apart from the side portions IL1-S and IL2-S of the first and second inorganic layers IL1 and IL2. The third groove BR3 may provide a third internal space BR-I3 and may be filled with the organic encapsulation layer OEL of the encapsulation layer TFE.

In an embodiment, since the display panel DP-3 includes the plurality of grooves BR1, BR2, and BR3 between the module hole MH and the side portions IL1-S and IL2-S of the inorganic layers, a penetration path of oxygen and moisture entering from the module hole MH may be effectively prevented. Thus, it may be possible to improve reliability of the display panel DP-3.

Figure 9:
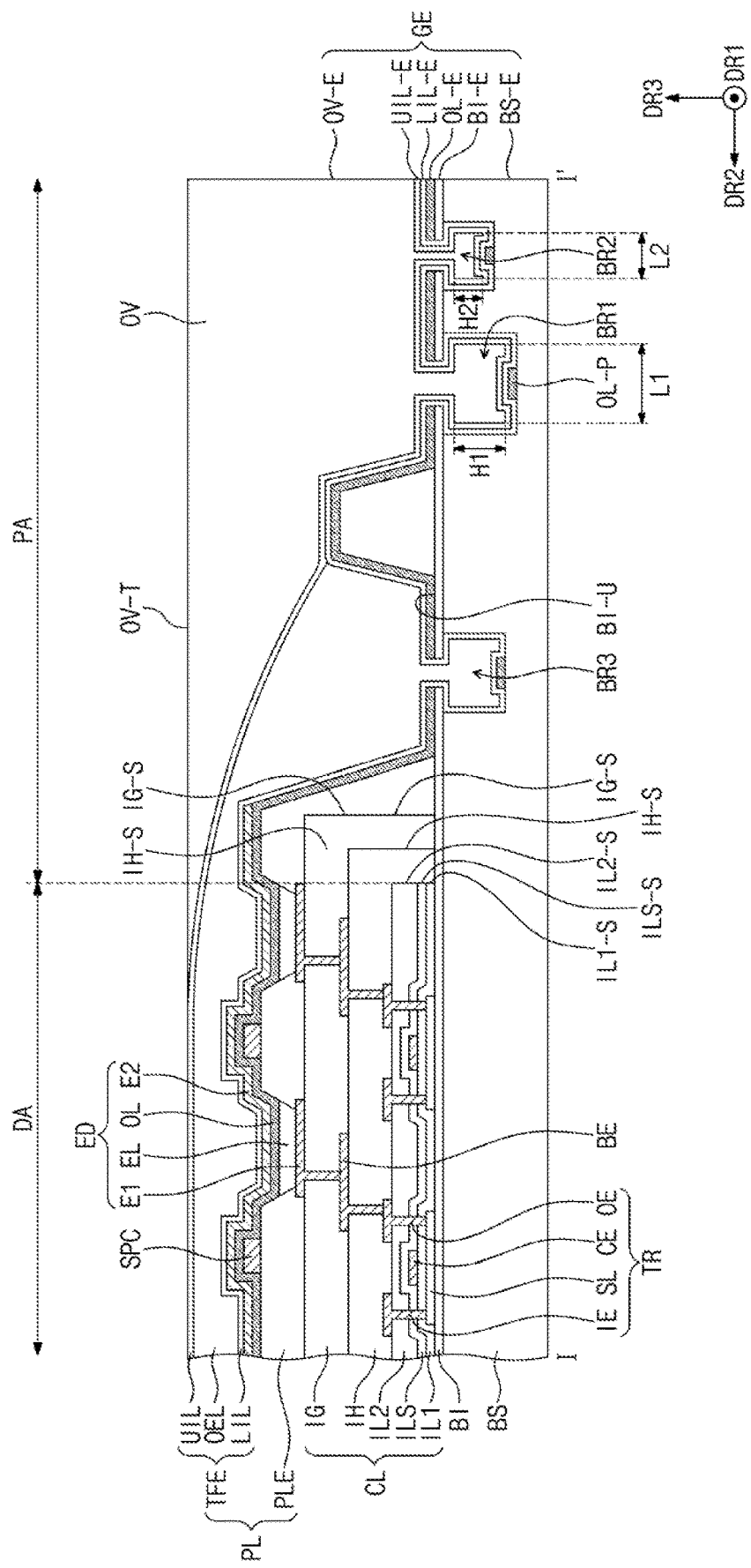
FIG. 9 illustrates a sectional view of a region of a display panel in an embodiment.

FIG. 9 illustrates a sectional view of a region of a display panel according to an embodiment. For concise description, the same reference numerals may be used in FIGS. 1 to 5C to denote the same features.

Referring to FIG. 9, a display panel DP-4 may include an additional organic layer IG and a connection electrode BE. The additional organic layer IG may be between the organic layer IH and the organic light emitting element ED. The additional organic layer IG may cover the organic layer IH. The additional organic layer IG may have a contact hole defined to penetrate the additional organic layer IG.

The connection electrode BE may be on the organic layer IH and may be connected to the output electrode OE through the contact hole, which is defined in the organic layer IH. The first electrode E1 may be connected to the connection electrode BE through a contact hole defined in the additional organic layer IG. Thus, the transistor TR and the organic light emitting element ED may be coupled to each other through the connection electrode BE. Since the display panel DP-4 further includes the connection electrode BE between the transistor TR and the organic light emitting element ED, it may be possible to reduce a contact resistance and thereby improve electric characteristics of the display panel DP-4.

In an embodiment, the display panel DP-4 may include an additional inorganic layer ILS. The additional inorganic layer ILS may be between the first and second inorganic layers IL1 and IL2. The additional inorganic layer ILS may cover the control electrode CE. An additional control electrode may be disposed on the additional inorganic layer ILS. The additional control electrode may be overlapped with the control electrode CE and may store an amount of charge corresponding to the voltage difference between the control electrode CE and the additional control electrode. Thus, the additional control electrode may perform the same function as the capacitor CAP (e.g., see FIG. 3).

A side portion ILS-S of the additional inorganic layer ILS may be covered with the organic layer IH. In an embodiment, a side portion of the side portions IL1-S, IL2-S, and ILS-S of the inorganic layers, which is nearest to the module hole MH, may define a boundary between the hole peripheral region PA and the display region DA. Thus, the side portions IL1-S, IL2-S, and ILS-S of the inorganic layers IL1, IL2, and ILS, which are in the display region DA, may be covered with the organic layer IH. This arrangement may make it possible to improve the delamination issue of the inorganic layers IL1, IL2, and ILS.

In an embodiment, the display panel DP-4 may include a spacer SPC disposed on the pixel definition layer PLE. The spacer SPC may be spaced apart from the light emitting layer EL. Thus, the spacer SPC may be spaced apart from a plurality of openings in the pixel definition layer PLE. Although the spacer SPC is illustrated to be separate from the pixel definition layer PLE, the spacer SPC and the pixel definition layer may be provided as a single object in another embodiment. Thus, the spacer SPC may be simultaneously formed during a process of forming the pixel definition layer PLE.

By contrast, the spacer SPC may be a black matrix formed to include an organic or inorganic light blocking material containing a black pigment or dye. In this case, the spacer SPC may prevent a light leakage phenomenon.

The grooves BR1, BR2, and BR3 may have different heights and different widths. For example, the first groove BR1 may have a first height H1 in the third direction DR3 and a first width L1 in the second direction DR2. The second groove BR2 may have a second height H2 in the third direction DR3 and a second width L2 in the second direction DR2. The first height H1 and the second height H2 may be different from each other. In addition, the first width L1 and the second width L2 may be different from each other. In the present embodiment, the first height H1 and the first width L1 may be greater than the second height H2 and the second width L2, respectively.

Figure 10A:
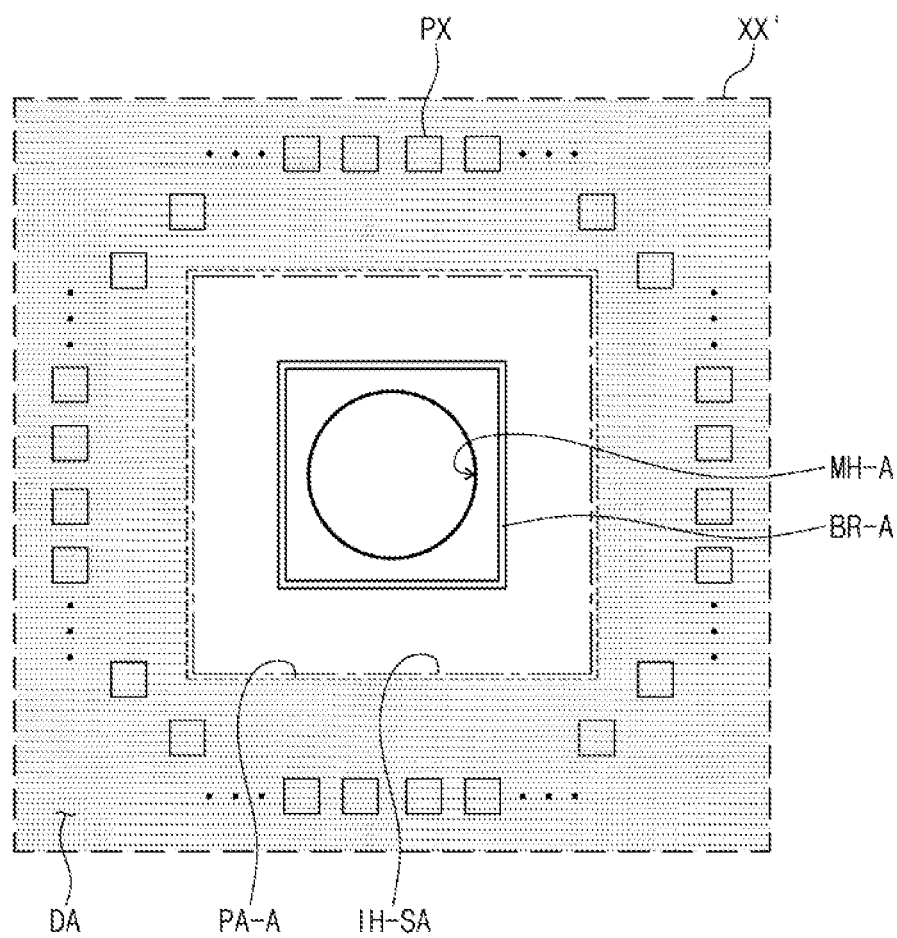
FIGS. 10A and 10B illustrates another embodiment of a display panel.
Figure 10B:
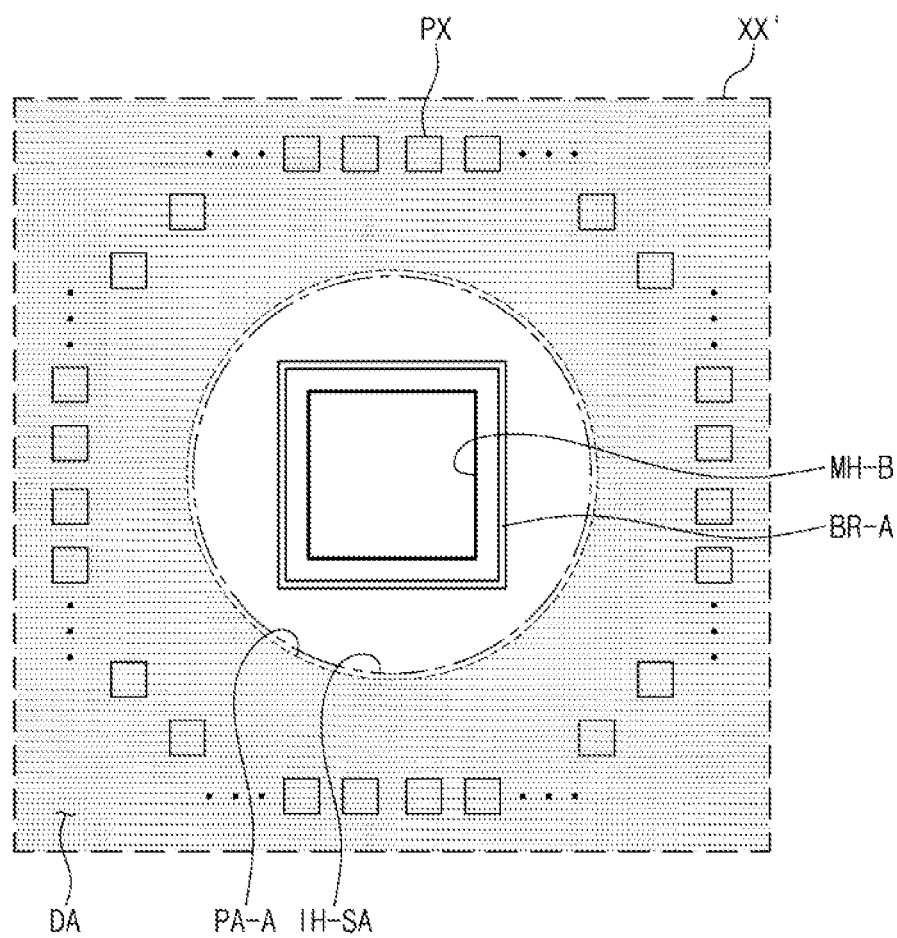

FIGS. 10A and 10B illustrate enlarged view of one or more embodiments of a display panel. For convenience in illustration, FIGS. 10A and 10B illustrates a region corresponding to region XX' of FIG. 5A. For concise description, the same reference numbers may be used in FIGS. 1 to 5C to denote the same features.

Referring to FIG. 10A, a module hole MH-A and a groove BR-A may have planar shapes different from each other. For example, a module hole MH-A may have a circular or elliptical shape. The groove BR-A may have a closed loop shape enclosing the module hole MH-A. In an embodiment, the closed loop shape of the groove BR-A may be a rectangular or tetragonal shape. In an embodiment, a planar shape of a hole peripheral region PA-A enclosing the groove BR-A may be rectangular or tetragonal.

Referring to FIG. 10B, the hole peripheral region PA-A may be defined by the side portion of the side portions IL1-S and IL2-S of the first and second inorganic layers IL1 and IL2, which is adjacent to the module hole MH. Thus, a side portion IH-SA of the organic layer IH covering the side portions IL1-S and IL2-S of the first and second inorganic layers IL1 and IL2 may also be spaced apart from the hole peripheral region PA and may have the same shape (e.g., a rectangular or tetragonal shape) as the hole peripheral region PA-A.

Since the module hole MH-A and the groove BR-A have planar shapes different from each other, the length of a penetration path of moisture and oxygen entering through the module hole MH-A may be increased, thereby making it possible to improve reliability of the display panel DP (e.g., see FIG. 2).

Referring to FIG. 10B, a module hole MH-B and a groove BR-B may have planar shapes different from each other. For example, the module hole MH-B may have a rectangular or tetragonal shape. The groove BR-B may enclose the module hole MH-B and may have a closed loop shape. In an embodiment, the closed loop shape of the groove BR-B may be circular or elliptical.

In an embodiment, a hole peripheral region PA-B enclosing the groove BR-B may have a circular or elliptical planar shape. Thus, a side portion IH-SB of the organic layer IH may also be spaced apart from the hole peripheral region PA and may have the same shape (e.g., a rectangular or tetragonal shape) as the hole peripheral region PA-B. The hole peripheral regions PA-A and PA-B, the module holes MH-A and MH-B, and/or the grooves BR-A and BR-B may have different planar shapes in other embodiments.

In the case where the planar shapes of the module hole and the groove BR-B are similar to each other, the area of a space between the module hole MH-B and the groove BR-B may be decreased. Thus, an occupying area of the hole peripheral region PA-B in the display region DA (e.g., see FIG. 2) may be reduced, thereby making it possible to reduce the influence of the hole peripheral region PA-B on the display region DA.

FIGS. 11A to 11D illustrate sectional views of an embodiment of a display panel, where a groove is disposed on the hole peripheral region. For concise description, the same reference numbers may be used in FIGS. 1 to 5C to denote the same features.

Figure 11A:
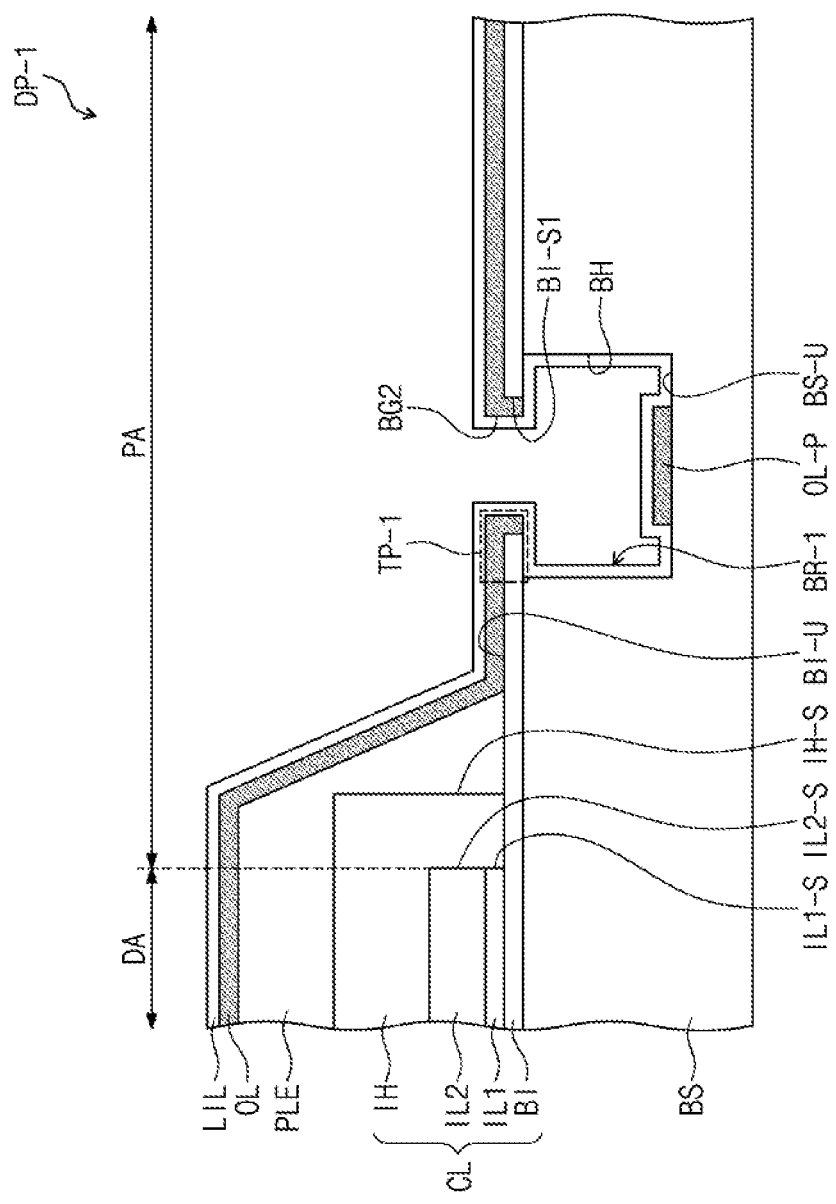
FIGS. 11A to 11D illustrate sectional views of an embodiment of a display panel.

Referring to FIG. 11A, in a tip portion TP-1 of the display panel DP-1 according to an embodiment of the inventive concept, a side portion BI-S1 of the barrier layer BI may be covered with the charge control layer OL, unlike the tip portion TP of FIG. 5C. The charge control layer OL covering the side portion BI-S1 of the barrier layer BI may be covered with the first inorganic encapsulation layer LIL. Thus, the tip portion TP-1 may have improved impact-resistant properties and the display panel DP-1 may have an improved reliability.

Figure 11B:
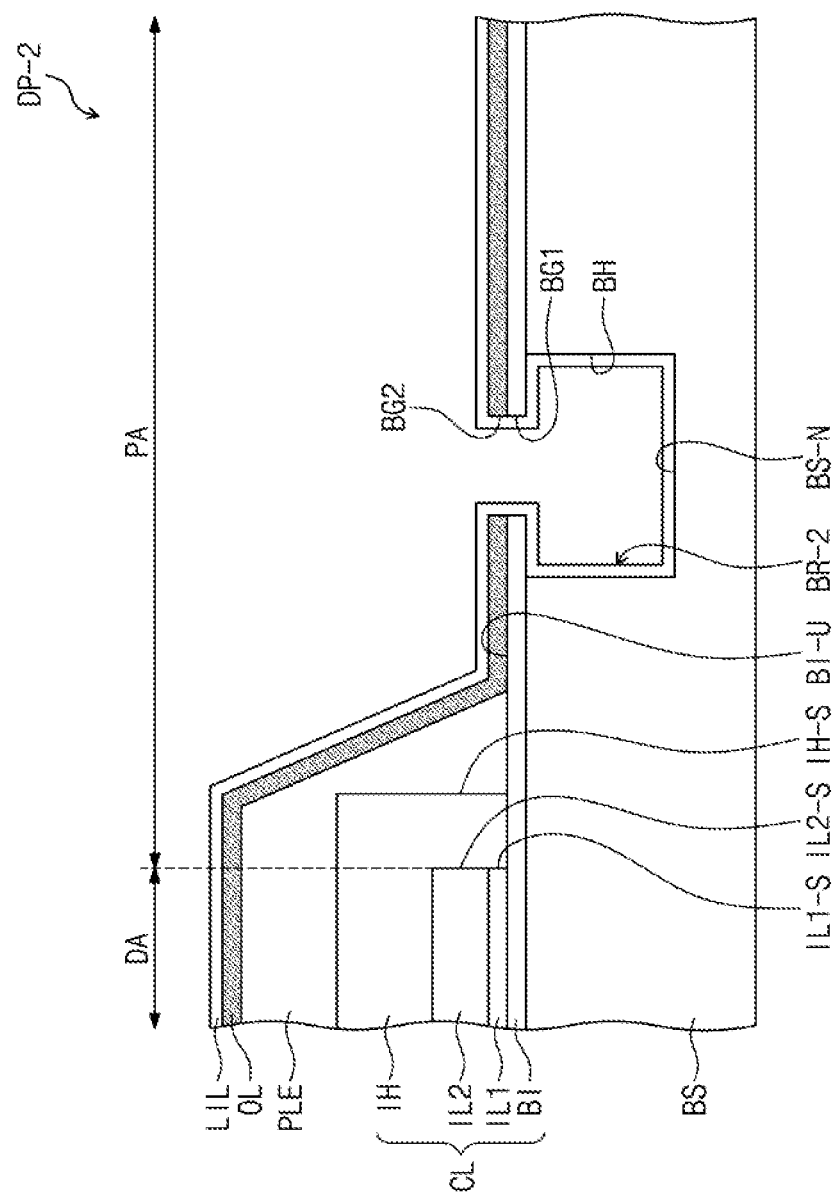

Referring to FIG. 11B, the additional pattern portion OL-P in the groove BR of FIG. 5C may be omitted from a groove BR-2 of the display panel DP-2. Thus, a surface BS-N of the base substrate BS, which is exposed by the recessing of the base substrate BS, may be in direct contact with the first inorganic encapsulation layer LIL.

Figure 11C:
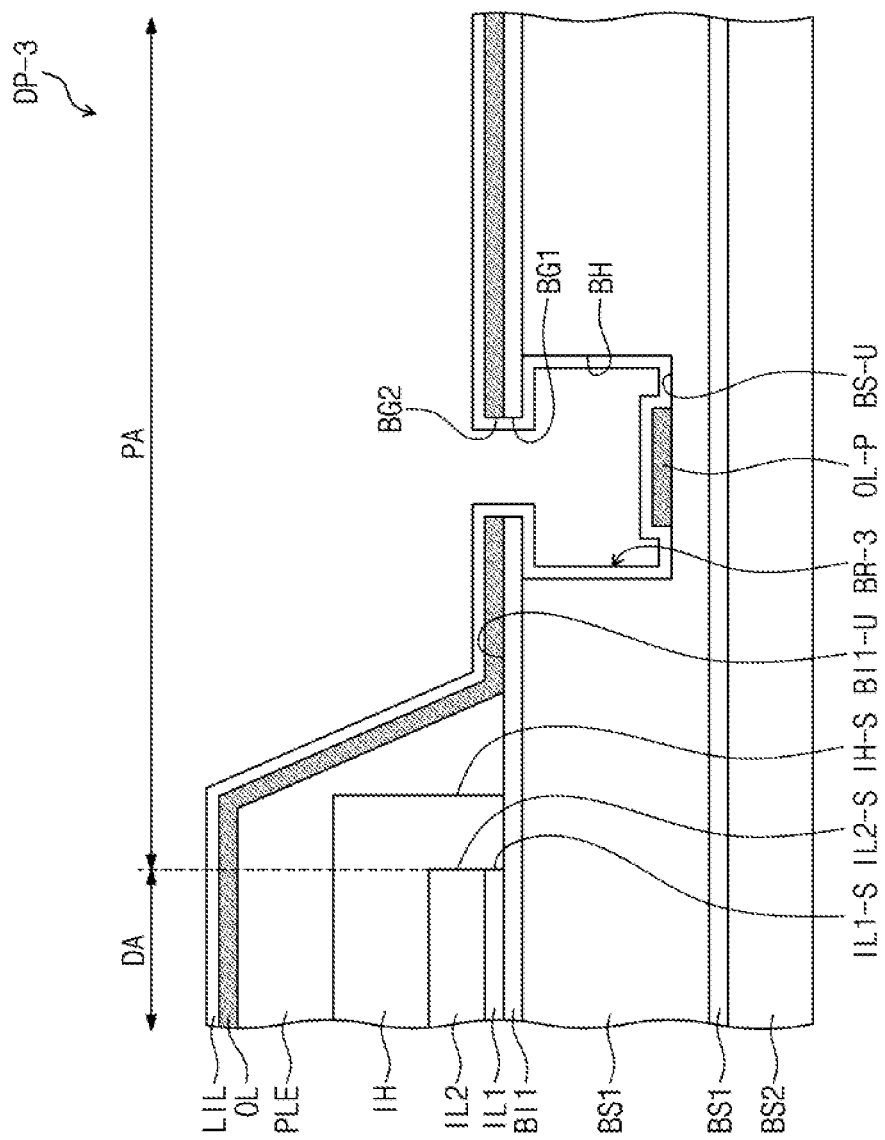

Referring to FIG. 11C, the display panel DP-3 may further include a first base substrate BS1, a first barrier layer BI1, a second base substrate BS2, and a second barrier layer BI2. A rear surface of the second base substrate BS2 may be defined as a rear surface of the display panel DP-3. The second barrier layer BI2 may be on the second base substrate BS2. The first base substrate BS1 may be on the second barrier layer BI2. The first barrier layer BI1 may be on the first base substrate BS1.

In an embodiment, a groove BR-3 may be a recessed region of the first base substrate BS1, which is partially recessed from a top surface BI1-U of the first barrier layer BI1 and which is covered with at least one of the first inorganic encapsulation layer LIL and the second inorganic encapsulation layer UIL. The base substrates BS1 and BS2 may be formed of or include at least one of organic materials, such as polyimide, polyethylene naphthalate, polyethylene terephthalate, polyarylate, polycarbonate, polyetherimide, or polyethersulfone.

The hauler layers BI1 and BI2 may be an insulating layer including an inorganic material. For example, the barrier layer BI may be formed of or include at least one of aluminum oxide ($AlO_x$), titanium oxide ($TiO_x$), silicon oxide ($SiO_x$), silicon oxynitride ($SiO_xN_y$), zirconium oxide ($ZrO_x$), or hafnium oxide ($HfO_x$). The barrier layers BI1 and BI2 may prevent an external contamination material from passing therethrough.

Figure 11D:
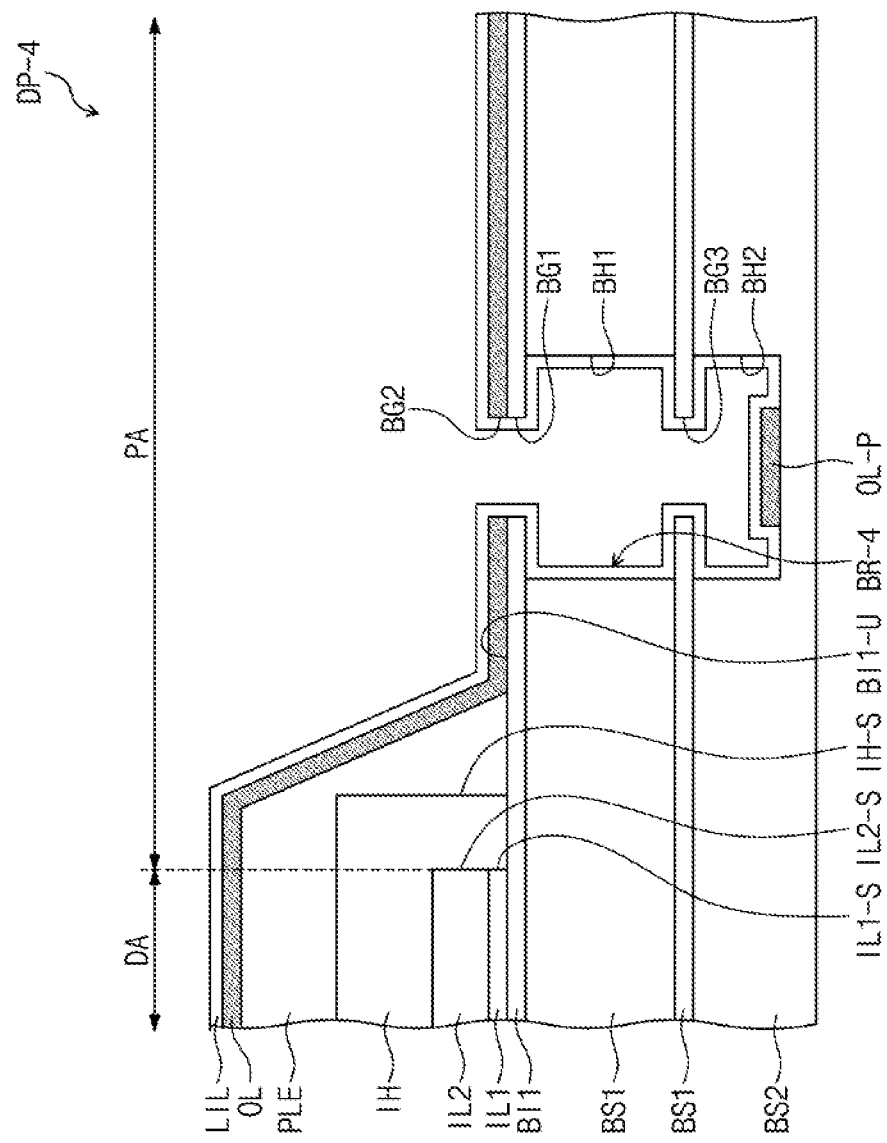

Referring to FIG. 11D, according to an embodiment of the inventive concept the display panel DP-4 may further include the first base substrate BS1, the first barrier layer BI1, the second base substrate BS2, and the second barrier layer BI2. In an embodiment, the first base substrate BS1, the first barrier layer BI1, the second base substrate BS2, and the second barrier layer BI2 may be substantially the same as those in the display panel DP-3 of FIG. 11C.

In an embodiment, the first barrier layer BI1 may include the first opening BG1 penetrating the first barrier layer BI1. The charge control layer OL may include the second opening BG2 penetrating the charge control layer OL. The first base substrate BS1 may include a penetration region BH1 penetrating the first base substrate BS1.

The second barrier layer BI2 may include a third opening BG3 penetrating the second barrier layer BI2. The second base substrate BS2 may include a recessed region BH2, which may be formed by recessing at least a portion of the second base substrate BS2.

In an embodiment, the first opening BG1, the second opening BG2, the penetration region BH1, the third opening BG3, and the recessed region BH2 may be overlapped with each other on the hole peripheral region PA.

At least one of the first inorganic encapsulation layer LIL and the second inorganic encapsulation layer UIL (e.g., see FIG. 5B) may include a portion covering an inner surface of each of the first opening BG1, the second opening BG2, the penetration region BH1, the third opening BG3, and the recessed region BH2 and defining a groove BR-4.

Since the multiple base substrates and the multiple barrier layers are penetrated or recessed to form the groove BR-4 of the display panel DP-4, they may increase the length of a penetration path of moisture and oxygen entering through the module hole MH (e.g., see FIG. 5B). This may make it possible to improve reliability of the display panel DP-4.

Furthermore, in the display panel DP-1, DP-2, DP-3, or DP-4 according to embodiments of the inventive concept, the side portions IL1-S and IL2-S of the first and second inorganic layers IL1 and IL2 may be spaced apart from the grooves BR-1, BR-2, BR-3, and BR-4. Thus, the likelihood of a delamination problem occurring at the tip portion TP (e.g., see FIG. 5C) may be reduced or prevent.

FIGS. 12A to 12I are sectional views illustrating an embodiment of method of fabricating a display panel. For concise description, elements previously described with reference to FIGS. 1 to 5C may be identified by the same reference numbers.

Figure 12A:
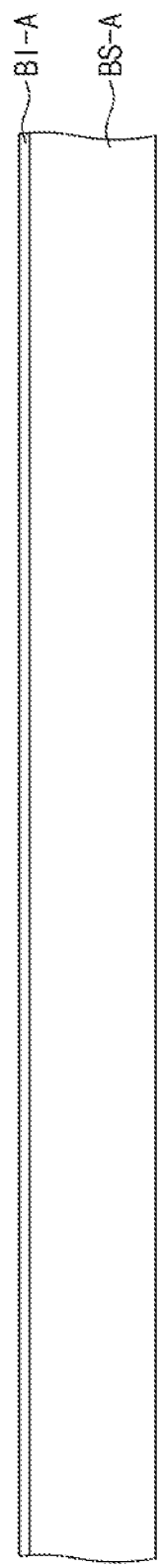
FIGS. 12A to 12I illustrates sectional views of various stages of a method of fabricating a display panel according to an embodiment.

Referring to FIG. 12A, a preliminary barrier layer BI-A may be formed on a preliminary base substrate BS-A. The barrier layer BI-A may be formed by depositing an inorganic material on the preliminary base substrate BS-A.

Figure 12B:
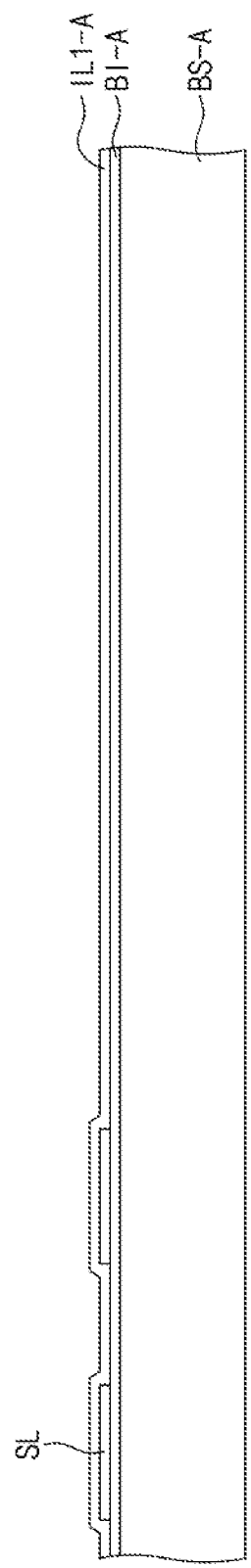

Referring to FIG. 12B, a conductive material may be deposited on the preliminary barrier layer BI-A and patterned to form the semiconductor pattern SL. Next, a preliminary first inorganic layer IL1-A including an inorganic material may be formed on the preliminary barrier layer BI-A. The preliminary first inorganic layer IL1-A may cover the semiconductor pattern SL.

Figure 12C:
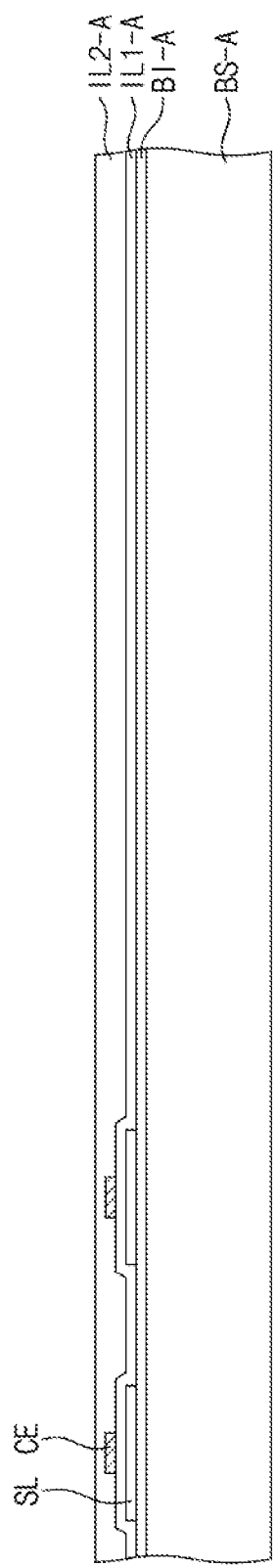

Referring to FIG. 12C, a conductive material may be deposited on the preliminary first inorganic layer IL1-A and patterned to form the control electrode CE. Next, the preliminary second inorganic layer IL2-A including an inorganic material may be formed on the preliminary first inorganic layer IL1-A. The preliminary second inorganic layer IL2-A may cover the control electrode CE.

Figure 12D:
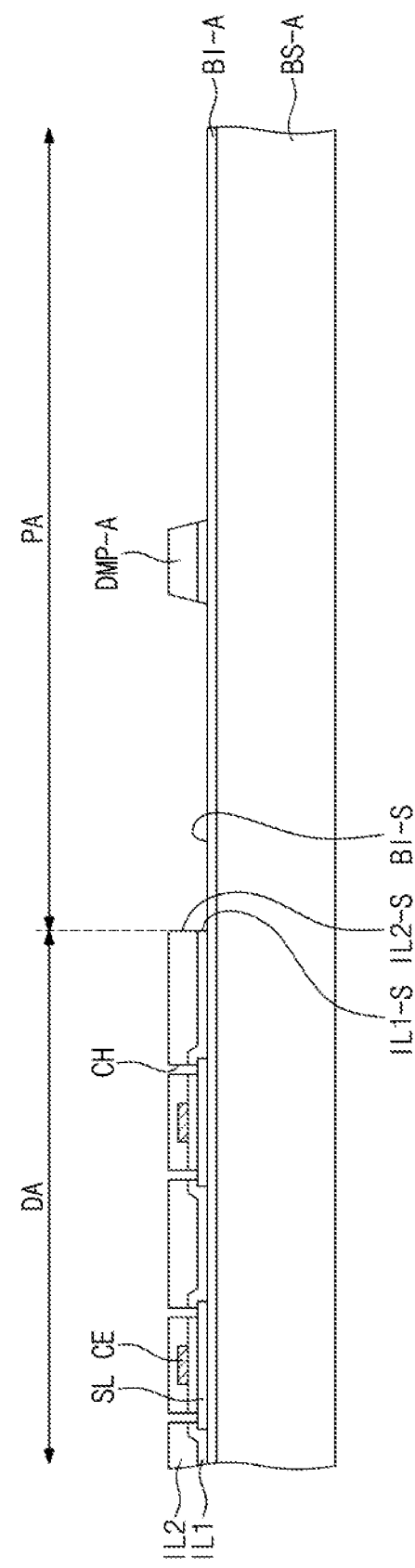

Referring to FIG. 12D, a contact hole CH may be formed to penetrate the preliminary first and second inorganic layers IL1-A and IL2-A. When the contact hole CH is formed, the preliminary first and second inorganic layers IL1-A and IL2-A may be patterned to expose a portion of the preliminary barrier layer BI-A and to form the first and second inorganic layers IL1 and IL2 with exposed side portions IL1-S and IL2-S on the display region DA.

The exposed side portions IL1-S and IL2-S of the preliminary first and second inorganic layers IL1 and IL2 may form a boundary between the hole peripheral region PA and the display region DA. In an embodiment, portions of the preliminary first and second inorganic layers IL1-A and IL2-A remaining on the hole peripheral region PA may be defined as a preliminary dam portion DMP-A.

Figure 12E:
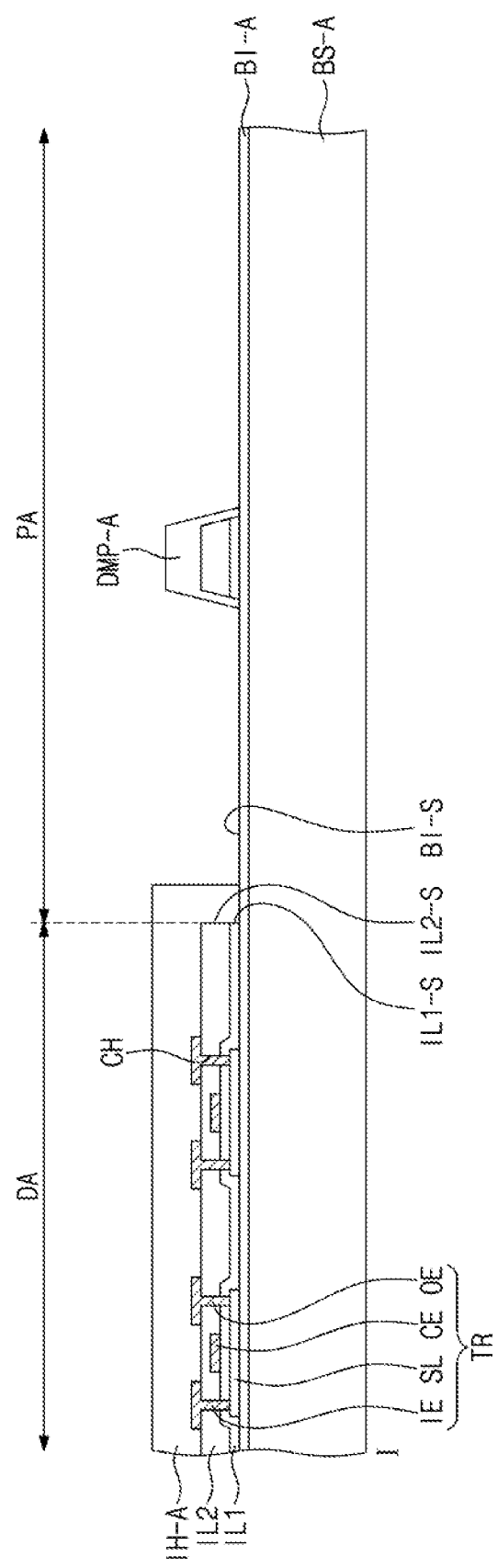

Referring to FIG. 12E, a conductive material may be deposited on the preliminary second inorganic layer IL2-A and patterned to form the input electrode IE and the output electrode OE. The input electrode IE and the output electrode OE may be coupled to the semiconductor pattern SL through the contact hole CH. The semiconductor pattern SL, the control electrode CE, the input electrode IE, and the output electrode OE may form the transistor TR.

Next, an organic material may be coated on the transistor TR to form a preliminary organic layer IH-A. The preliminary organic layer IH-A may cover the side portions IL1-S and IL2-S of the first and second inorganic layers IL1 and IL2. The preliminary dam portion DMP-A may also be covered with the organic material.

Figure 12F:
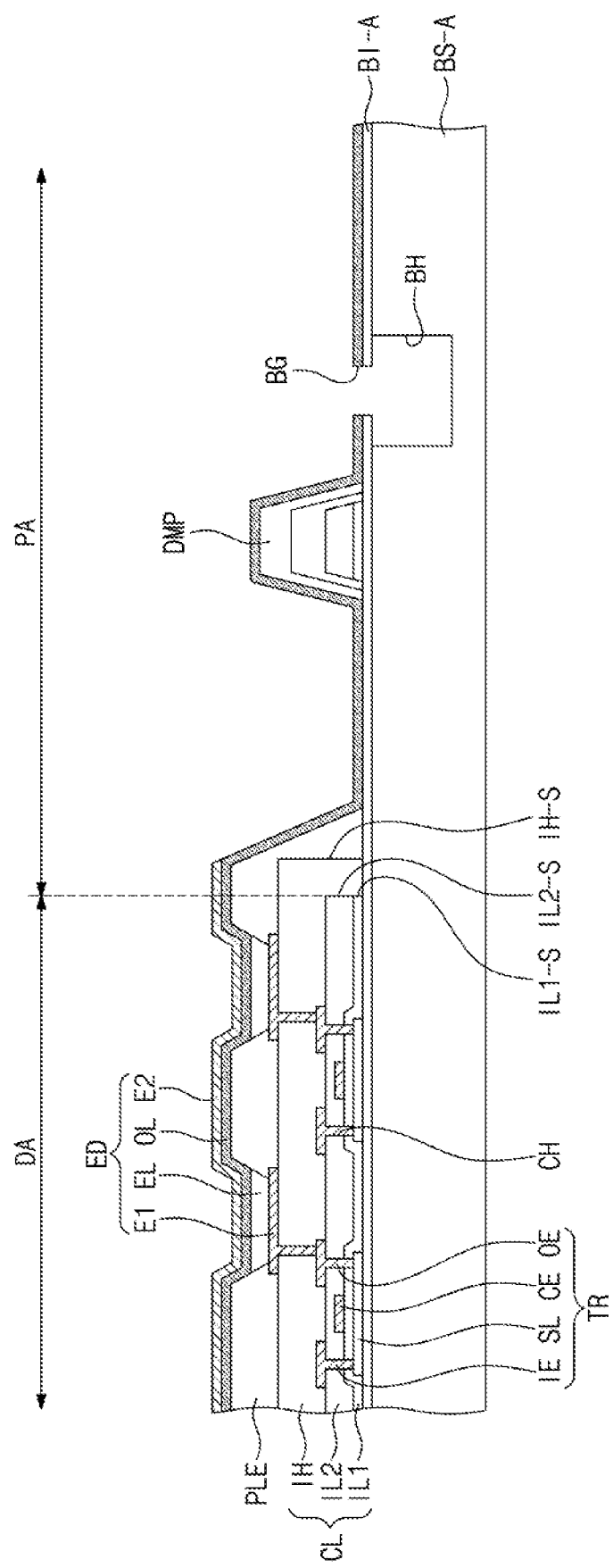

Referring to FIG. 12F, the organic layer IH may be formed by forming the contact hole CH to penetrate the preliminary organic layer IH-A. A conductive material may be deposited on the organic layer IH and may be patterned to form the first electrode E1, which is connected to the output electrode OE through the contact hole CH. Thereafter, the pixel definition layer PLE may be formed to have an opening exposing at least a portion of the first electrode E1.

Next, the organic light emitting element ED may be formed on the pixel definition layer PLE. The organic light emitting element ED may include a light emitting layer EML, the charge control layer OL, and the second electrode E2, which are formed by respective deposition processes.

The charge control layer OL may be formed to cover both of the display region DA and the hole peripheral region PA. In an embodiment, the charge control layer OL may be formed to cover the entire top surface of the display region DA and the hole peripheral region PA. The charge control layer OL may cover the dam portion DMP and may cover a portion of the recessed region BH.

Thereafter, an opening BG may be formed to penetrate the charge control layer OL and the preliminary barrier layer BI-A. Then, a portion of the preliminary base substrate BS-A may be removed to form the recessed region BH. A portion of the preliminary base substrate BS-A and the preliminary barrier layer BI-A may be removed by an ashing process. The asking process may be performed using a plasma ashing process. An opening BG and the recessed region BH may be formed on the hole peripheral region PA to be overlapped with each other.

Figure 12G:
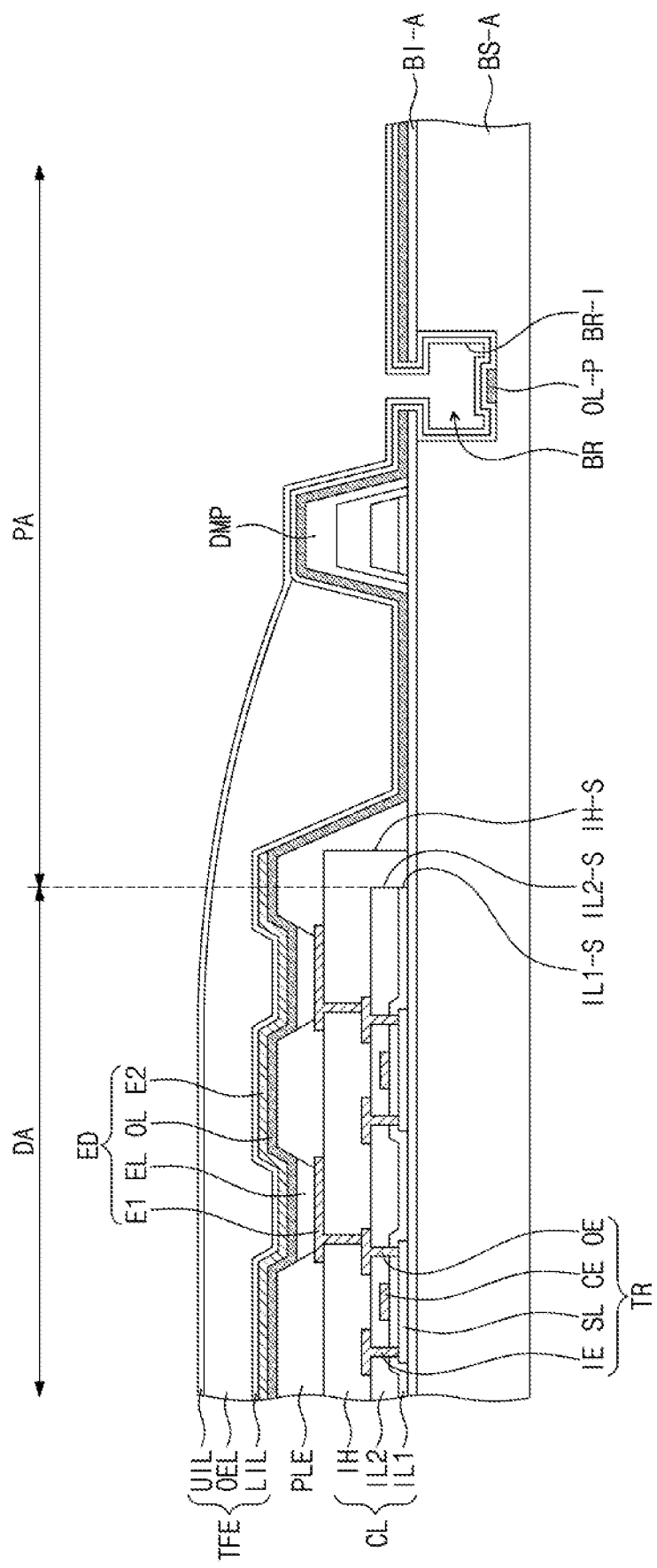

Referring to FIG. 12G, the first inorganic encapsulation layer LIL including an inorganic material may be formed on the display region DA and the hole peripheral region PA. Thereafter, the organic encapsulation layer OEL including an organic material may be formed on the first inorganic encapsulation layer LIL.

In an embodiment, a liquid organic material may be supplied to form the organic encapsulation layer OEL. During the formation of the organic encapsulation layer OEL, the darn portion DMP may be used to delimit a spreading boundary of the liquid organic material. The organic encapsulation layer OEL may be formed by coating the first inorganic encapsulation layer LIL with a liquid organic material using an inkjet method. In this case, the dam portion DMP may prevent the liquid organic material from overflowing outside of the darn portion DMP, thereby delimiting the spread boundary of the liquid organic material.

Next, the second inorganic encapsulation layer UIL including an inorganic material may be formed on the display region DA and the hole peripheral region PA. The first inorganic encapsulation layer LIL and the second inorganic encapsulation layer UIL may be formed to be in contact with each other on the hole peripheral region PA.

Figure 12H:
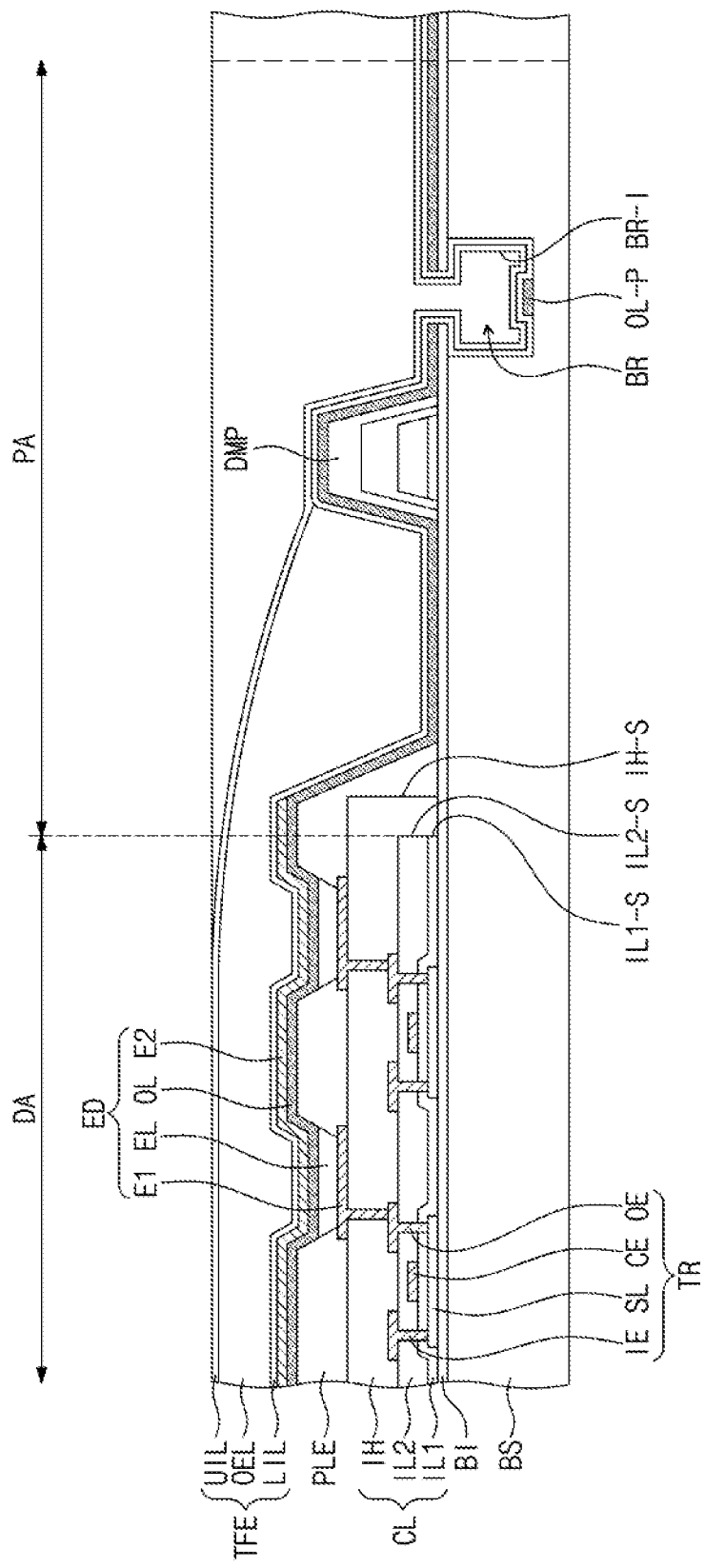

Referring to FIG. 12H, the planarization layer OV including an organic material may be formed. The planarization layer OV may be disposed to cover the front surface of the hole peripheral region PA. In an embodiment, the planarization layer OV may be formed of or include the same material as the organic encapsulation layer OEL.

Figure 12I:
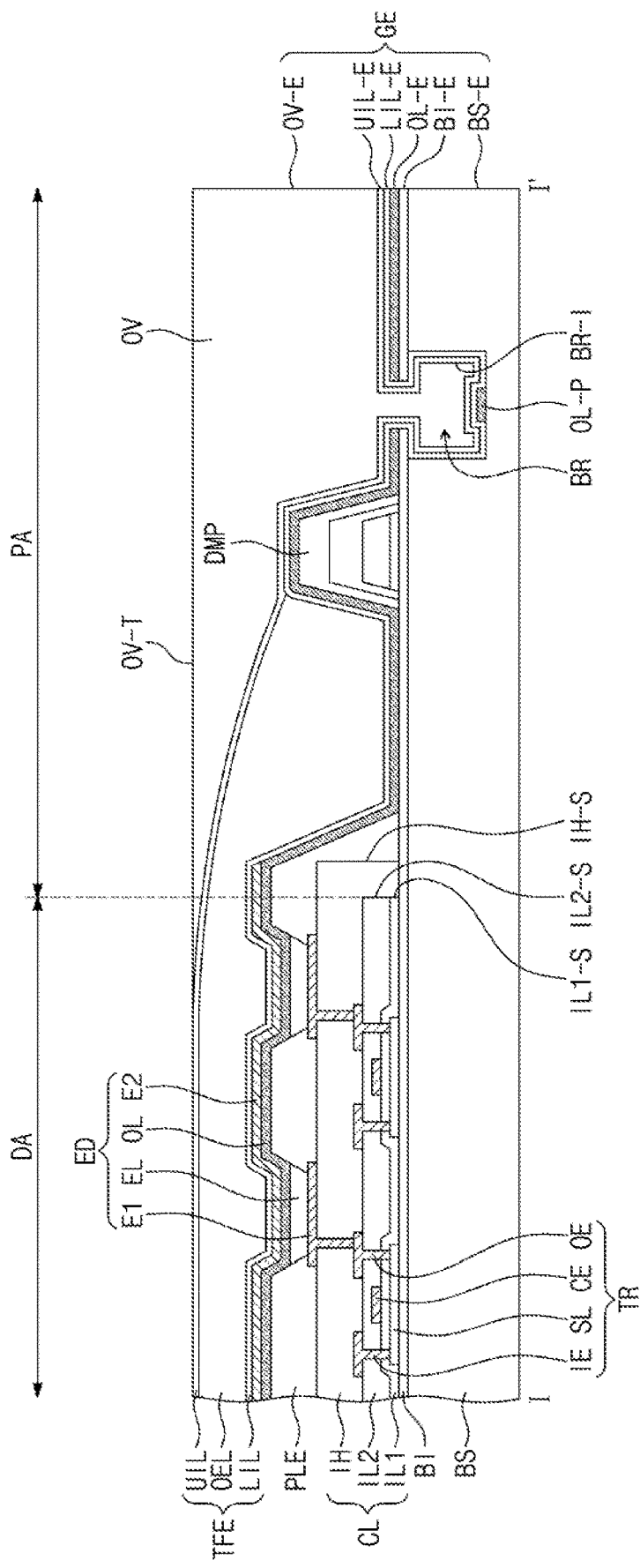

Referring to FIG. 12I, the module hole MH may be formed in a region overlapped with the hole peripheral region PA of the display region DA. The module hole MH may be formed by the inner surface GE, at which the end portion BS-E of the base substrate BS, the end portion BI-E of the barrier layer BI, the end portion OL-E of the charge control layer OL, the end portion LIL-E of the first inorganic layer IL1, the end portion UIL-E of the second inorganic layer IL2, and the end portion OV-E of the planarization layer OV are aligned to each other.

In an embodiment, since each of the side portions IL1-S and IL2-S of the first and second inorganic layers IL1 and IL2 is spaced apart from the groove BR, the first and second inorganic layers IL1 and IL2 in the circuit layer CL may be omitted from the tip portion TP. Thus, it may be possible to simplify the inorganic layers disposed in the tip portion TP, reduce or prevent the occurrence of a delamination issue in the tip portion TP, and improve reliability of the display panel DP.

In accordance with one or more of the aforementioned embodiments, a display panel is configured to prevent interference with an electronic module. Thus, even if the electronic module is provided in a display device, the display device may have a narrow bezel region. In addition, it may be possible to easily prevent deterioration, degradation, and other forms of damage caused by the infiltration of external moisture or oxygen. This may make it possible to improve reliability in process and usage of the display device. In addition, one or more embodiments described herein may have improved impact-resistant properties and may prevent contamination by external material (e.g., oxygen and moisture).

While example embodiments of the inventive concepts have been particularly shown and described, it will be understood by one of ordinary skill in the art that variations in form and detail may be made therein without departing from the spirit and scope of the attached claims.

What is claimed is:

1. A display panel including a hole, a display region and a hole peripheral region between the hole and the display region, comprising:
   a base substrate including a first groove and a second groove both in the hole peripheral region, the second groove is between the hole and the first groove;
   a barrier layer on the base substrate;
   a transistor on the barrier layer;
   a first electrode coupled to the transistor;
   a light emitting layer on the first electrode;
   a second electrode on the light emitting layer;
   a first inorganic encapsulation layer on the second electrode;
   an organic encapsulation layer on the first inorganic encapsulation layer; and
   a second inorganic encapsulation layer on the organic encapsulation layer, wherein the first inorganic encapsulation layer and the second inorganic encapsulation layer are in the second groove, wherein the first inorganic encapsulation layer is in the first groove, wherein the second inorganic encapsulation layer is not in the first groove.

2. The display panel of claim 1, wherein the display panel further includes:

a circuit layer on the barrier layer, the circuit layer including the transistor and a plurality of insulating layers, the plurality of insulating layers includes a first inorganic layer, a second inorganic layer on the first inorganic layer, and an organic layer, wherein a side portion of each of the first inorganic layer and the second inorganic layer adjacent to the hole encloses the hole and is covered by the organic layer.

3. The display panel of claim 1, wherein the first groove is filled with organic encapsulation layer.

4. The display panel of claim 1, further comprising:

a dam between the first groove and the second groove, and the dam includes a first dam portion and a second dam portion sequentially stacked.

5. The display panel of claim 4, wherein the second dam portion covers a side surface of the first dam portion.

6. The display panel of claim 4, further comprising:

an interlayer insulation layer between the transistor and the first electrode, the interlayer insulation layer covers the transistor; and a pixel definition layer between the first electrode and the first inorganic encapsulation layer, the pixel definition layer includes an opening exposing the first electrode.

7. The display panel of claim 6, wherein the first dam portion has a same material as the interlayer insulation layer, and the second dam portion has a same material as the pixel definition layer.

8. The display panel of claim 1, wherein:

a portion of the barrier layer, which covers a portion of the base substrate overlapped with the first groove and the second groove, corresponds to a tip portion, and the tip portion is covered with the first inorganic encapsulation layer.

9. The display panel of claim 1, wherein: the first groove and the second groove have a closed loop shape enclosing the hole.

10. The display panel of claim 1, further comprising:

a planarization layer on the second inorganic encapsulation layer to provide a flat surface.

11. The display panel of claim 10, wherein the second groove is filled with the planarization layer.

12. The display panel of claim 11, further comprising:

an input sensing area on the second inorganic encapsulation layer, the input sensing area includes an organic sensing layer covering a sensing electrode.

13. The display panel of claim 12, wherein the organic sensing layer includes a same material as the planarization layer.

14. The display panel of claim 13, wherein the hole penetrates the planarization layer.

* * * * *